US006871315B2

(12) United States Patent
Seki

(10) Patent No.: US 6,871,315 B2
(45) Date of Patent: Mar. 22, 2005

(54) DECODING CIRCUIT AND DECODING METHOD THEREOF

(75) Inventor: Katsutoshi Seki, Tokyo (JP)

(73) Assignee: NEC Corporation, Tokyo (JP)

( * ) Notice: Subject to any disclaimer, the term of this patent is extended or adjusted under 35 U.S.C. 154(b) by 472 days.

(21) Appl. No.: 09/905,968

(22) Filed: Jul. 17, 2001

(65) Prior Publication Data

US 2002/0029367 A1 Mar. 7, 2002

(30) Foreign Application Priority Data

Jul. 19, 2000 (JP) ......................................... 2000-218297

(51) Int. Cl.[7] .......................................... H03M 13/00
(52) U.S. Cl. ...................................... 714/782
(58) Field of Search ................................ 714/781–782, 714/784–785, 752, 755, 786, 791, 793, 795

(56) References Cited

U.S. PATENT DOCUMENTS

| 4,566,105 | A | | 1/1986 | Oisel et al. .................. | 714/756 |
| 4,567,594 | A | | 1/1986 | Deodhar ...................... | 714/769 |
| 4,649,541 | A | | 3/1987 | Lahmeyer .................... | 714/784 |
| 4,852,098 | A | | 7/1989 | Brechard et al. ............ | 714/782 |
| 5,535,225 | A | * | 7/1996 | Mayhew et al. ............. | 714/785 |
| 5,537,429 | A | * | 7/1996 | Inoue .......................... | 714/782 |
| 5,872,799 | A | | 2/1999 | Lee et al. .................... | 714/755 |
| 6,658,605 | B1 | * | 12/2003 | Yoshida et al. .............. | 714/702 |

FOREIGN PATENT DOCUMENTS

| EP | 0 656 734 A2 | 6/1995 |
| EP | 0 821 492 A2 | 1/1998 |
| EP | 0 924 935 A2 | 6/1999 |
| EP | 1 033 843 A2 | 9/2000 |
| GB | 2 263 985 A | 8/1993 |
| JP | 55-36219 | 9/1980 |
| JP | 03-248637 | 11/1993 |
| JP | 06-276106 | 9/1994 |
| JP | 08-335923 | 12/1996 |
| JP | 2000-165816 | 6/2000 |

OTHER PUBLICATIONS

European Search Report dated Jun. 21, 2004.
Matsushima T.K., et al.: "Parallel Encoder and Decoder Architecture for Cyclic Codes", IEICE Transactions on Fundamentals of Electronics, Communications and Computer Sciences, Institute of Electronics Information and Comm. Eng. Tokyo, JP., vol. 79,, No. 9, Sep. 1996, pp. 1313–1323.
Hideki Imai, "Code Theory", the Institute of Electronic Information and Communication Engineers, Mar., 1990, not english.
Australian Office Action dated Aug. 1, 2002.
Japanese Office Action dated Jan. 21, 2003 with partial translation.
Japanese Office Action dated Jun. 17, 2003, with partial English translation.

* cited by examiner

Primary Examiner—Shelly A Chase
(74) Attorney, Agent, or Firm—McGinn & Gibb, PLLC

(57) ABSTRACT

A decoding circuit and a decoding method thereof can significantly reduce circuit scale and power consumption. The decoding circuit, in which a plurality of code words are transmitted in interleaved manner and a plurality of code words are simultaneously decoded on reception side, comprises a decoder which decodes a plurality of said code words simultaneously.

19 Claims, 26 Drawing Sheets

DECODING CIRCUIT AND DECODING METHOD THEREOF

BACKGROUND OF THE INVENTION

1. Field of the Invention

The present invention relates generally to a decoding circuit and a decoding method thereof. More particularly, the invention relates to a BCH code (Bose-Chaudhuri-Hocquenghem code) decoding circuit which is used in a system where a plurality of code words are transmitted in interleaving manner and simultaneous decoding of plurality of code words is required on reception side.

2. Description of the Related Art

Conventionally, as Read-Solomon decoder, a system assigning Read-Solomon decoder per code word has been known in the art. Such system has been disclosed in Hideki IMAI, "Code Theory", the Institute of Electronic Information and Communication Engineers, March, 1990 (hereinafter referred to as reference), or so forth.

However, the foregoing system has large circuit scale and large power consumption, and is not suitable for application where a plurality of code words are transmitted in interleaved form and simultaneous decoding of a plurality of code words is required on reception side.

A system construction upon constructing a system for simultaneously decoding L in number of code words using the prior art is shown in FIG. 22. In FIG. 22, first to (M)th reception code words are input to first to (M)th decoders 11-1 to 11-M. The first to (M)th decoders 11-1 to 11-M perform decoding and output first to (M)th corrected code words.

Construction of each of the first to (M)th decoders 11-1 to 11-M is shown in FIG. 23. For the purpose of disclosure, the decoders (11-1 to 11-M) will be generally identified by 11. In FIG. 23, the decoder 11 is constructed with a syndrome calculating portion 12, an error position polynomial expression/error value polynomial expression leading portion 13, an error position/error value calculating portion 14, a reception code word storing portion 15 and an error correcting portion 16.

For example, considering the case of decoding of the code word having code length of 255 bytes which is consisted of an information signal of 239 bytes and a redundancy inspection signal of 16 bytes, a signal of 1 byte is converted into the element of Galois field containing 256 elements. A primitive polynomial of Galois field is $x^8+x^4+x^3+x^2+1$. Assuming primitive element is $\alpha$, generating polynomial $G(x)$ is expressed by:

$$G(x)=(x-1)(x-\alpha^2)\ldots(x-\alpha^{15}) \quad (1)$$

Discussion for the foregoing example will be given hereinafter.

A construction of syndrome calculating portion 12 in FIG. 23 is shown in FIG. 24. The syndrome calculating portion 12 is constructed with sixteen Galois field adders 121-1 to 121-16, sixteen feedback shift registers 122-1 to 122-16, sixteen Galois field constant multiplier ($\times\alpha^0, \times\alpha^1, \ldots, \times\alpha^{15}$) 123-1 to 123-16, a counter 126, Galois filed constant multiplier input signal selectors 124-1 to 124-16 and syndrome coefficient output selectors 125-1 to 125-16.

The syndrome calculating portion 12 calculates a coefficient $S_i$ of syndrome polynomial $S(z)$ defined by:

$$S(z)=S_0+S_1z+S_2z^2+\ldots+S_{15}z^{15} \quad (2)$$

The syndrome coefficient $S_i$ is defined by:

$$S_i = Y(\alpha^i) \quad (3)$$
$$= Y_0 + Y_1\alpha^1 + Y_2\alpha^{2i} + Y_3\alpha^{3i} + \ldots + Y_{254}\alpha^{254i}$$
$$i = 0, \ldots 15$$

Here, in the foregoing expression (3), $Y_{(x)}$ is a reception polynomial and $\alpha$ is primitive element.

The expression (2) can be modified with the expression (3) as follow:

$$S_i=(\ldots((Y_{254}\alpha^i+Y_{253})\alpha^i+Y_{252})\alpha^i+\ldots+Y_1)\alpha^i+Y_0 \quad (4)$$

Accordingly, in order to sequentially calculate syndrome coefficient relative to the reception code word $Y_j$, calculation is progressed as:

$$S_i \leftarrow (S_i\alpha^i+Y_j)$$

The reception code word $(Y_{254}, \ldots, Y_0)$ is input per one byte in synchronism with a clock. When the counter 126 is input the leading end $Y_{254}$ of the reception code word, the counter 126 is reset to zero. Subsequently, the counter 126 is incremented a counter value per clock. The counter 126 controls the Galois field constant multiplier input signal selectors 124-1 to 124-16 and the syndrome coefficient output selectors 125-1 to 125-16 by the counter value.

When the counter value is zero, the Galois field constant multiplier input signal selectors 124-1 to 124-16 output zero. In this case, the leading end $Y_{254}$ of the reception code word is set to the feedback shift registers 122-1 to 122-16. When the counter value is other than zero, Galois field constant multiplier input signal selectors 124-1 to 124-16 output value of the outputs of the feedback shift registers 122-1 to 122-16.

When the counter value is j (0<j<255), the outputs of feedback shift registers 122-1 to 122-16 are multiplied by a constant ($\alpha^i$) by the Galois field constant multipliers 123-1 to 123-16 and are added the reception code word $Y_{245-j}$ in the Galois field adders 121-1 to 121-16, and the result of the adding is inputted to the feedback shift registers 122-1 to 122-16 and the content of the shift register is updated.

The reception code words $(Y_{245}, \ldots, Y_0)$ are input in sequential order from $Y_{254}$ (descending order). When $Y_0$ is read out, the contents of the shift registers 122-1 to 122-16 become $S_i$. At this time, the counter value becomes 254.

When the counter value is 254, the syndrome coefficient output selectors 125-1 to 125-16 take the outputs of the feedback shift registers 122-1 to 122-16 as syndrome coefficients and output them to the error position polynomial and error value polynomial leading portion 13.

The error position polynomial and error value polynomial leading portion 13 leads error position polynomial and error value polynomial using Euclidean algorithm for outputting an error position polynomial coefficient and error value polynomial coefficient to the error position and error value calculating portion 14. The error position polynomial $\sigma(z)$ is expressed by:

$$\sigma(z)=\sigma_0+\sigma_1z+\ldots+\sigma_8z^8 \quad (5)$$

On the other hand, the error value polynomial $\omega(z)$ is expressed by $$\omega(z)=\omega_0+\omega_1z+\ldots+\omega_7z^7 \quad (6)$$

Euclidean algorithm has been disclosed in the foregoing reference, associated disclosure of the above-identified reference is herein incorporated by reference for the sake of disclosure.

The error position and error value calculating portion 14 leads the error position and the error value from the error position polynomial coefficient and the error value polynomial coefficient to output to an error correcting portion 16. Here, error value denominator polynomial $\sigma_{odd}(z)$ is introduced.

The error value denominator polynomial a $\sigma_{odd}(z)$ is one taking out odd number order component from the error position polynomial $\sigma(z)$ and is expressed by:

$$\sigma_{odd}(z)=\sigma_1 z+\sigma_3 z^3+\sigma_5 z^5+\sigma_7 z^7 \qquad (7)$$

By sequentially inputting powers of $\alpha(\alpha^i)$ (i=1 . . . , 255) to the error position position polynomial $\sigma(Z)$, when $\sigma(\alpha^i)=0$ is established, it can be appreciated that error is caused in (255−i)th order component $Y_{255-i}$ of the reception word. Such method for deriving a solution by sequentially replacing powers of $\alpha(\alpha^i)$ is referred to as Chien solution. The theoretical background of capability of leading the error position from the error position polynomial has been disclosed in the above-identified reference. The relevant portion of the disclosure in the reference is herein incorporated by reference for the sake of disclosure.

On the other hand, the error value caused in the (255−i)th order component $Y_{255-i}$ is expressed by $\omega(\alpha^i)/\sigma_{odd}(\alpha^i)$. A numerator of error value ($\omega(\alpha^i)$) and denominator ($\sigma_{odd}(\alpha^i)$) are derived by using Chien solution.

A construction of the error position and error value calculating portion 14 set forth above is illustrated in FIG. 25. In FIG. 25, the error position and error value calculating portion 14 is constructed with an error position Chien solution portion 141, an error value denominator Chien solution portion 142, an error value numerator Chien solution portion 143, an error position judgment portion 144, a Galois field division circuit 145 and a counter 146.

The counter 146 is responsive to input of the error position polynomial coefficient $\sigma_0, \ldots \sigma_8$, and error value polynomial coefficient $\omega_0, \ldots, \omega_7$, to be reset to zero. Subsequently, the counter 146 is incremented the counter value per clock.

The construction of the error position Chien solution portion 141 is shown in FIG. 26. In FIG. 26, the error position Chien solution portion 141 is constructed with nine feedback shift registers 1412-1 to 1412-9, nine Galois field constant multipliers 1413-1 to 1413-9, nine feedback register input signal selectors 1411-1 to 1411-9, and nine-input Galois field adder 1414.

Using FIG. 26, discussion will be given for operation of the error position Chien solution portion 141. When the counter value is zero, the feedback shift registers 1411-1 to 1411-9 outputs error position polynomial coefficients $\sigma_0, \ldots, \sigma_8$ to set the error position polynomial coefficients $\sigma_0, \ldots, \sigma_8$ to the feedback shift registers 1412-1 to 1412-9. The outputs of the feedback shift registers 1412-1 to 1412-9 storing the (k)th order error position polynomial coefficient $\sigma_k$ are multiplied for $\alpha^k$ times by the Galois field constant multipliers 1413-1 to 1413-9.

When the counter value is other than zero, the feedback shift register input signal selectors 1411-1 to 1411-9 select outputs of the Galois field constant multipliers 1413-1 to 1413-9. Accordingly, when the counter value is other than zero, the feedback shift registers 1412-1 to 1412-9 are updated by the outputs of the Galois field constant multipliers 1413-1 to 1413-9.

The outputs of the feedback shift registers 1412-1 to 1412-9 are input to nine-input Galois field adder 1414. The nine-input Galois field adder 1414 outputs a result of addition to the error position judgment circuit 144. Shifting is repeated for 255 times. Upon (i)th shift, the output of the nine-input Galois field adder 1414 becomes $\sigma(\alpha^i)$.

The error value denominator Chien solution portion 142 is realized by a circuit construction similar to the error position Chien solution portion 141 to output $\sigma_{odd}(\alpha^i)$ at (i)th shift. The error value numerator Chien solution portion 143 is realized by similar circuit construction as the error position Chien solution portion 141 to output $\omega(\alpha^i)$ at (i)th shift.

Upon (i)th shift, $\sigma_{odd}(\alpha^i)$ output from the error value denominator Chien solution portion 142 and $\omega(\alpha^i)$ output from the error value numerator Chien solution portion 143 are input to a Galois filed division circuit 145. The Galois filed division circuit 145 outputs the result of division $\omega(\alpha^i)/\sigma_{odd}(\alpha^i)$ as error value to the error position judgment circuit 144.

Upon (i)th shift, $\sigma(\alpha^i)$ output from the error position Chien solution portion 141 is input to the error position judgment circuit 144. The error position judgment circuit 144 makes judgment upon occurrence of error in the (255−i)th order component $Y_{255-1}$ when $\sigma(\alpha^i)=0$, for outputting the error position 255−i and error value $\omega(\alpha^i)/\sigma_{odd}(\alpha^i)$ input from the Galois field division circuit 145 to the error correcting portion 16. The error position judgment circuit 144 makes judgment from the counter value of current shifting number.

The error correcting portion 16 corrects received code word stored in the received code word storing portion 15 on the basis of the error position and the error value input from the error position and error value calculating portion 14 to externally output the corrected code word.

In the conventional decoder, since circuit scale is large and power consumption is also large, a plurality of code words are transmitted in interleaved manner, and is not suitable for application in a system which is required to simultaneously decode a plurality of code word on reception side.

SUMMARY OF THE INVENTION

The present has been worked out in view of the problem set forth above. It is therefore an object of the present invention to provide a decoding circuit and a decoding method thereof which can significantly reduce circuit scale and power consumption.

According to the first aspect of the present invention, a decoding circuit, in which a plurality of code words are transmitted in interleaved manner and a plurality of code words are simultaneously decoded on reception side, comprises a decoder which decodes a plurality of said code words simultaneously.

According to the second aspect of the present invention, a decoding method in a system wherein a plurality of code words are transmitted in interleaved manner and a plurality of code words are simultaneously decoded on reception side, comprises a step of simultaneously decoding a plurality of said code words with a single decoder.

Namely, BCH code (Bose-Chaudhuri-Hocquenghem code) decoding circuit according to the present invention is characterized by capability of realization of BCH decoding circuit and method which can simultaneously decode a plurality of code words.

More particularly, the decoding circuit according to the present invention uses Read-Solomon code as one kind of the BCH code and simultaneously processes a plurality of code words with one decoder. Hereinafter, the number of code words is assumed to be L, the code length is assumed to be N blocks, a redundancy inspection length is assumed to be K blocks, a parallel process number is assumed to be M and a Galois field primitive polynomial order number is assumed to be D. When the code length N is not divisible with the parallel process number M, an auxiliary signal is added to the lead end of the code word. An auxiliary signal length P (N+P) is the least natural number P to make (N+P) divisible with M, and the value of the auxiliary signal is set zero. In the following, discussion will be given for parallel process which parallel process is not essential.

In the decoding circuit according to the present invention, the decoder is constructed with a syndrome calculating portion, the error position polynomial and error value polynomial leading portion, the error position and error value calculating portion, the received code word calculating portion and the error correcting portion.

The syndrome calculating portion calculates syndrome polynomial S1 to SL of the first to (L)th codewords. The syndrome polynomial S1 of the first code word and its coefficients $S1_0$ to $S1_{k-1}$ are defined as follows:

$$S1(z) = S1_0 + S1_1 z + S1_2 z^2 + \ldots + S1_{K-1} z^{K-1} \quad (8)$$

$$S1i = Y1(\alpha^i) \quad (9)$$
$$= Y1_0 + Y1_1 \alpha^i + Y1_2 \alpha^{2i} + \ldots + Y1_{N-1} \alpha^{(N-1)i}$$

$i=0$ to $K-1$

Here, $\alpha$ is primitive element. The foregoing expression (9) can be modified as follow:

$$S1_i = (\ldots (Y1_{N-1} \alpha^i + Y1_{N-2}) \alpha^i + Y1_{N-3}) \alpha i + \ldots + Y1_1) \alpha^i + Y1_0 \quad (10)$$

Accordingly, the syndrome coefficient may be calculated as $$S1_i \leftarrow (S1_i \alpha^i + Y1_j) \quad (11)$$

with respect to the received code word $Y1_j$.

Since the present invention performed the parallel process, preliminary process expressed as follow:

$$U1_{ij} = Y1_{M+J-1} \alpha^{(M-1) \cdot i} + Y1_{M \cdot 1 - 2} \alpha^{(M-2) \cdot 1} + \ldots + Y1_{M \cdot (J-1)} \quad (12)$$

$i=0$ to $K-1$, $j=N/M$ to 1 for sequentially updating syndrome coefficient as follow:

$$S1_i \leftarrow (S1_i \alpha^{Mi} + U1_{ij}) \quad (13)$$

The syndrome polynomial S2 to SL of the second to (L)th code words may be derived similar to the foregoing process.

The syndrome calculating portion is constructed with (0)th to (K-1)th order syndrome coefficient calculating portion, a syndrome coefficient updating pre-processing portion and a counter. In the present invention, L in number of code words are processed simultaneously and thus the first to (L)th code words are input to the syndrome calculating portion sequentially from higher order component per M blocks.

Namely, in the initial L clocks, (N-1)th to (N-M)th components of the first to (L)th codewords ($Y1_{N-1}, \ldots, Y1_{N-M}$), $\ldots$, ($YL_{N-1}, \ldots, YL_{N-2M}$) are input. In the next L clocks, (N-M-1) to (N-2) components of the first to (L)th code words ($Y1_{N-M-1}, \ldots, Y1_{N-2M}$), $\ldots$, ($YL_{N-M-1}, \ldots, YL_{N-2M}$) are input. M parallel input signals are named as $I_{M-1}, I_{M-2}, \ldots, I_0$ from the higher order component.

The M parallel input signals $I_{M-1}, I_{M-2}, \ldots, I_0$ are input to the syndrome coefficient updating pre-process portion. The syndrome coefficient updating pre-process portion performs preliminary process expressed by the foregoing expression (12). Particularly, for the input signals $I_{M-1}, I_{M-2}, \ldots, I_0$, the following process is performed:

$$UP_0 = I_{M-1} + I_{M-2} + \ldots + I_0 \quad (14.0)$$

$$UP_1 = I_{M-1} \alpha^{(M-1)} + I_{M-2} \alpha^{(M-2)} + \ldots + I_0 \quad (14.1)$$

$$UP_2 = I_{M-1} \alpha^{(M-1) \cdot 2} + I_{M-2} \alpha^{(M-2) \cdot 2} + \ldots + I_0 \quad (14.2)$$

.

.

.

$$UP_{K-1} = I_{M-1} \alpha^{(M-1) \cdot (K-1)} + I_{M-2} \alpha^{(M-2) \cdot (K-1)} + \ldots + I_0 \quad (14, K-1)$$

The (0)th to (K-1)th syndrome coefficient updating signals UPi (i=0, ..., K-1) are output to the (0)th to (K-1)th syndrome coefficient calculating portion.

Considering the input signal IM-1, the input signal IM-1 performs multiplication of (K-1) in number of Galois field constant during process expressed by (14.0) to (14.K-1). One Galois field constant multiplication can be realized by a combined circuit of D bit inputs and D bit outputs.

However, in the present invention, as (K-1) in number of Galois field constant multiplications can be realized by a combined circuit of D bit input and D*(K-1) bit outputs, the K-1 in number of Galois field constant multiplications can be taken in common. Therefore, in comparison with K-1 in number of combined circuits each having D bit input and D bit output, circuit scale and power consumption can be reduced significantly.

The counter is reset to zero when leading end (Y1N-1, ..., Y1N-M) of the first received codeword is inputted. Subsequently, the counter is incremented the counter value per clock and output the counter value to (0)th to (K-1)th order syndrome coefficient calculating portions. The (0)th to (K-1)th order syndrome coefficient calculating portions sequentially performs calculation of the syndrome coefficient according to the expression (13).

The (i)th order syndrome coefficient calculating portion is constructed with the Galois field adder, the first to (L)th stage feedback shift registers, the Galois field constant multiplier, the Galois field constant multiplier input signal selecter and the syndrome coefficient output selecter.

When the counter value is 0 to L-1, the Galois field constant multiplier input signal selector outputs zero, and when the counter value is out of the range of 0 to L-1, the output of the (L)th stage feedback shift register to the Galois field constant multiplier. The Galois field constant multiplier multiplies the input signal by a constant ($\alpha^i$) to output to the Galois filed adder. The Galois filed adder takes the (i)th order syndrome coefficient updating signal $UP_i$ inputted from the syndrome coefficient updating pre-process portion and the output of the Galois field constant multiplier input signal selector as inputs to output the result of addition to the first stage feedback shift register. The first to (L)th stage feedback shift registers shift the content of the shift register per clock.

When the counter value is in a range of 0 to L-1, the Galois field constant multiplier input signal selector outputs zero, and the Galois field constant multiplier also outputs zero. In this case, the Galois filed adder outputs the (i)th order syndrome coefficient updating signals UPi to the first stage feedback shift register as it is.

Accordingly, when the counter value is L, $UL_{i,N/W}$ is stored in the first stage feedback shift register and $U1_{i,N/M}$ is stored in the (L)th stage feedback shift register. When the counter value is L, the Galois field constant multiplier input signal selector outputs the output of the (L)th stage feedback shift register to the Galois field constant multiplier.

The output $U1_{i,N/M}$ of the (L)th stage feedback shift register multiplied by the constant ($\alpha^i$) by the Galois field constant multiplier is summed with the input signal $U1_{iN/M-1}$ in the Galois filed adder. The result of addition is output to the first stage feedback shift register. When the counter value is L+1, the content of the shift register of the first stage feedback shift register is updated. In this case, the content $UL_{i,N/M}$ stored in the first stage feedback shift register is shifted to the second stage feedback shift register.

The foregoing process is nothing but the process of the expression (13). The foregoing process is repeated until the next frame is input. When the leading end of the frame is input, the syndrome coefficients SL to S1 of the former frame are stored in the first to (L)th stage feedback shift registers. When the counter value is 0, the syndrome coefficient output selector outputs the outputs of the first to (L)th stage feedback shift registers to the error position polynomial and error value polynomial leading portion 3 as the syndrome coefficients SL to S1. In the present invention, by employing the L stage feedback shift registers, a syndrome coefficient updating loop of the first to (L)th received code word are processed once with L in number of clocks.

The syndrome calculating portion according to the present invention performs Galois field constant multiplication of M*(K-1) times. Conventionally, L in number of syndrome calculation portions perform Galois field constant multiplication of L*(K-1) times. When the number of code word L and the number of parallel process M are the same, the syndrome calculating portions of the prior art and the present invention can be realized by the same clock frequency. The same is true for the Galois filed constant multiplication number.

However, in the present invention, in the syndrome coefficient updating pre-processing portion 21, by making common Galois filed constant multiplication in common, scale of the circuit can be reduced.

When parallel process is not performed, the syndrome calculating portion according to the present invention, can realize syndrome calculation of L code words only by adding L-1 in number of shift registers for the conventional syndrome calculating portion. Thus, circuit scale can be reduced significantly.

The error position polynomial and error value polynomial leading portion is constructed with first to (L)th code word error position polynomial and error value polynomial leading portion. In the first to (L)th code word error position polynomial and error value polynomial leading portion, respective syndrome coefficients S1 to SL are input.

The first to (L)th code word error position polynomial and error value polynomial leading portion lead first to (L)th code word error position polynomial $\sigma 1$ to $\sigma L$ and first to (L)th error value polynomial $\omega 1$ to $\omega L$ using Euclid algorithms to output to the error position and error value calculating portion. The first code word error position polynomial $\sigma 1$ and the first code word error value polynomial $\omega 1$ are defined by the following expressions (15) and (16).

$$\sigma 1(z) = \sigma 1_0 + \sigma 1_1 z + \ldots + \sigma 1_{k/2} z^{k/2} \quad (15)$$

$$\omega 1(z) = \omega 1_0 + \omega 1_1 z + \ldots + \omega 1_{k/2-1} z^{k/2-1} \quad (16)$$

Euclid algorithms has been disclosed in the above-identified reference.

The error position and error value calculating portion leads the error position and error value from the error position polynomial coefficient and the error value polynomial coefficient to output to the error correcting portion. Here, the error value denominator polynomial $\sigma_{odd}$ which is derived by extracting odd number order component from the error position polynomial $\sigma$, is lead. A first codeword error value denominator polynomial $\sigma 1_{odd}$ is defined by the following expression (17):

$$\sigma 1_{odd}(z) = \sigma 1_1 z + \sigma 1_3 z^3 + \sigma 1_5 z^5 + \ldots + \sigma 1_{K/2-1} z^{K/2-1} \quad (17)$$

Similarly, the second to (L)th codeword error value denominator polynomials $\sigma 2_{odd}$ to $\sigma L_{odd}$ can be defined in the similar manner as the first code word error value denominator polynomial $\sigma 1_{odd}$.

Powers $\alpha^j$ (j=1, ..., N) is replaced in the first code word error position polynomial $\sigma 1$ sequentially. When $\sigma(\alpha^j) = 0$, it can be appreciated that error is caused in (N-j)th order component of the first received code word. Thus, such method for deriving a solution by sequentially replacing powers of $\sigma(\alpha^j)$ is referred to as Chien solution. The theory to lead the error position from the code word error position polynomial has been disclosed in the above-identified reference.

On the other hand, the error value caused in the (N-j)th order component $Y_{N-j}$ is expressed by $\omega 1(\alpha^j)/\sigma 1_{odd}(\alpha^j)$. A numerator of error value ($\omega 1(\alpha^j)$) and error value denominator ($\sigma_{odd}(\alpha^j)$) are derived by using Chien solution.

The error position and error value calculating portion is constructed with an error position Chien solution portion, an error value denominator Chien solution portion, an error value numerator Chien solution portion, an error position judgment circuit, a Galois field division circuit and a counter.

The counter is responsive to inputting of the error position polynomial coefficients $\sigma 1$ to $\sigma L$ and the error value polynomial coefficients $\omega 1$ to $\omega L$ to be reset to zero. Subsequently, the counter is incremented the counter value per clock.

The error position Chien solution portion is constructed with (0)th to (K/2)th order component calculating portions, the feedback shift register input signal selector and the M parallel Galois field adders.

When the counter value is 0 to (L-1), the feedback shift register input signal selector is sequentially output the first to (L)th code word (i)th order error position polynomial coefficients $\sigma 1_i$ to $\sigma L_i$ to the (L)th stage feedback shift register. When the counter value is out of a range of 0 to L-1, the feedback shift register input signal selector outputs the output of the (L-1)th stage feedback shift register to the (L)th stage feedback shift register. The (L)th stage feedback shift register delays the input signal for one clock to output to the M parallel Galois field multiplier.

Assuming that the input signal of the M parallel Galois field multiplier is INMULT, the M parallel Galois filed multiplier performs processes shown in the expressions following (18-1) to (18-M) to output $\sigma MUL1i$ to $\sigma MULMi$ to the first to (M)th Galois filed adders.

$$\sigma MUL1_i = INMULT * \alpha^i \quad (18\text{-}1)$$

$$\sigma MUL2_i = INMULT * \alpha^{2i} \quad (18\text{-}1)$$

.

.

.

$$\sigma MULM_i = INMULT * \alpha^{Mi} \quad (18\text{-}1)$$

One Galois field constant multiplication can be realized by a combined circuit of D bit inputs and D bit outputs. The M parallel Galois field multiplier performs M in number of Galois field constant multiplication. Then, the Galois field multiplier can be realized by M in number of combined circuits, each having D bit inputs and D bit outputs.

However, in the shown embodiment of the present invention, the M parallel Galois field multiplier is realized by a combined circuit of D bit inputs and D*M bit outputs. In this case, arithmetic operation common to M in number of Galois field constant multiplication can be made common to significantly reduce circuit scale and power consumption.

Output σMULMi of the M parallel Galois field multipliers is branched into two and is also output to the first stage feedback shift register. The first to (L)th stage feedback shift registers shift the content of the shift register per clock. When the counter value is 1, σMULMi becomes $\sigma 1_i * \alpha^{M*i}$. The value $\sigma 1_i * \alpha^{M*i}$ is shifted through the first to (L)th stage feedback shift registers. When the counter value is L+1, σMULMi is input to the M parallel Galois field multiplier. At this time, σMULMi becomes $\sigma 1_i * \alpha^{2*M*i}$.

Similarly, when the counter value is L, the output σMULMi becomes $\sigma 1_i * \alpha^{M*i}$. When the count value is 2*L, the output σMULMi becomes $\sigma L_i * \alpha^{2*M*i}$. In the shown embodiment of the present invention, by employing (L) stage of feedback shift register, L in number of code words are processed by L clocks. When the counter value is J*L+C (C=1, . . . , L), the output of the M parallel Galois field multiplier is expressed by the following expressions (19-1) to (19-M).

$$\sigma MUL1_i = \sigma C_i * \alpha^{(M*J+1)*i} \quad (19\text{-}1)$$

$$\alpha MUL2i = \sigma C_i * \alpha^{(M+J+2)*i} \quad (19\text{-}2)$$

·
·
·

$$\alpha MULMi = \sigma Ci * \alpha^{(M*J+M)*1} \quad (19\text{-}M)$$

The (i)th Galois field adder inputs σMULi₀ to σMULi$_{K/2}$ output from the (0)th to (K/2)th order component calculating portions to output the result of sum σSUMi to the error position judgment circuit.

Similarly, the first to (M)th Galois field adders outputs the results of addition σSUM1 to σSUMM to the error position judgment circuit. When the counter value is J*L+C (C=1, . . . , L), the sums σSUM1 to σSUMM are expressed by the expressions the following (20-1) to (20-M).

$$\sigma SUM1 = \sigma MULT0 + \ldots + \sigma MULT1_{k/2} \quad (20\text{-}1)$$
$$= \sigma C_0 + \sigma C_1 * \alpha^{(M*J+1)} + \sigma C_2 * \alpha^{(M*J+1)*2} + \ldots +$$
$$\sigma C_{k/2} * \alpha^{(M+J+1)*K/2}$$
$$= \sigma C(\alpha^{(M*J+1)})$$

$$\vdots$$

$$\sigma SUMi = \sigma MULTi0 + \ldots + \sigma MULTi_{k/2} \quad (20\text{-}i)$$
$$= \sigma C_0 + \sigma C_1 * \alpha^{(M*J+1)} + \sigma C_2 * \alpha^{(M*J+1)*2} + \ldots +$$
$$\sigma Ci * \alpha \sigma C_{K/2} * \alpha^{(M*J+i)*K/2}$$
$$= \sigma C(\alpha^{M*J+i})$$

$$\sigma SUMM = \sigma MULTM0 + \ldots + \sigma MULTM_{k/2} \quad (20\text{-}M)$$
$$= \sigma C_0 + \sigma C_1 * \alpha^{(M*J+1)} + \sigma C_2 * \alpha^{(M*J+M)*2} + \ldots +$$
$$\sigma C_{K/2} * \alpha^{(M*J+M)*K/2}$$
$$= \sigma C(\alpha^{M*J+M})$$

The error value denominator Chien solution portion inputs coefficients (σ1₁, σ1₃, . . . , σ1$_{k/2-1}$) to (σL₁, σL₃, . . . , σL$_{K/2-1}$) of the first to (L)th code word error value denominator polynomials σ1$_{odd}$ to σL$_{odd}$ to output σ$_{odd}$SUM1 to σ$_{odd}$SUMM to the Galois field division circuit.

When the counter value is J*L+C (C=1, . . . , L), the σodd SUM1 to σoddSUMM to σSUM are expressed by:

$$\sigma_{odd}SUM1 = \sigma_{odd}C(\alpha^{M*J+1}) \quad (21\text{-}1)$$

·
·
·

$$\sigma_{odd}SUMM = \sigma_{odd}C(\alpha^{M*J+M}) \quad (21\text{-}M)$$

The error value numerator Chien solution portion inputs coefficients (ω1₁, ω1₃, . . . , ω1$_{k/2-1}$) to (ωL₁, ωL₃, . . . , ωL$_{K/2-1}$) of the first to (L)th code word error value polynomials ω1 to ωL to output ωSUM1 to ωSUMM to the Galois field division circuit. When the counter value is J*L+C (C=1, . . . , L), ωSUM1 to ωSUMM are expressed by the following expressions (22-1) to (22-M).

$$\omega SUM1 = \omega C(\alpha^{M*J+1}) \quad (22\text{-}1)$$

·
·
·

$$\omega SUMM = \omega C(\alpha^{M*J+M}) \quad (22\text{-}M)$$

From expressions (20-1) to (20-M), (21-1) to (21-M) and (22-1) to (22-M), the error value denominator Chien solution portion and the error value numerator Chien solution portion can be realized by similar architecture as the error position Chien solution portion.

The Galois filed division circuit performs division of ωSUM1 to ωSUMM and ω$_{odd}$SUM1 to ω$_{odd}$SUMM to output the result of division EV1 to EVM to the error position judgment circuit. When the counter value is J*(L+C) (C=1, . . . , L), the result of division EV1 to EVM are expressed by the following expressions (23-1) to (23-M).

$$EV1 = (\omega SUM1)/\sigma_{odd}SUM1[\omega C(\alpha^{M*J+1})]/(\sigma_{odd}SUM1)] \quad (23\text{-}1)$$

·
·
·

$$EVM = (\omega SUMM)/\sigma_{odd}SUMM[\omega C(\alpha^{M*J+M})]/[\sigma_{odd}C(\alpha^{M*J+M})] (23\text{-}1)$$

The error position judgment circuit makes judgment of the error position from the input signals σSUM1 to σSUMM. From the expressions (20-1) to (20-M) and (23-1) to (23-M), when the counter value is J*L+C (C=1, . . . , L) and σSUMi=0, judgment can be made that error of the error value EVi is caused in the (N−M*J)th order component $YC_{N-M*J}$ the (C)th code word. At this time, the error position judgment circuit outputs the error position N−M*J and the error value EV1 to the error correction circuit.

The error position and error value calculating portion performs Galois filed constant multiplication for (5K/4−1) *M times. The L in number of error position and error value calculating portion in the prior art performs Galois field constant multiplication of (5K/4−1)*L times. When the number of code words L and number of parallel processes M are the same, the syndrome calculating portions in the prior art and the present invention can be realized at the same clock frequency, and number of times of Galois field constant multiplication also becomes the same.

However, in the shown embodiment, in the error position Chien solution portion, the error value denominator Chien solution portion and the error value numerator Chien solution portion, arithmetic operation common to a plurality of Galois field constant multiplication can be made common to significantly reduce circuit scale and power consumption.

When parallel process is not performed, the error position and error value calculating portion can realize syndrome calculation of L code words only by adding L−1 in number of shift registers for the conventional syndrome calculating portion.

The error position and the error value are lead from the error position polynomial coefficient and the error value polynomial coefficient, and are output to the error correcting portion. The error correcting portion corrects the received code word stored in the received code word storing portion on the basis of the error position and the error value input from the error position and error value calculating portion to externally output the corrected code word.

It should be noted that while the decoders are assigned per the code word upon decoding a plurality of code words simultaneously in the prior art, the shown embodiment significantly reduces the circuit scale and the power consumption by decoding a plurality of code word simultaneously with single decoder.

The first feature of the shown embodiment of the present invention is that simultaneous decoding of L in number of code words can be realized by adding L−1 in number of shift registers in the syndrome calculating portion and by adding L−1 in number of shift registers in the error position and error value calculating portion. Thus, circuit scale can be reduced significantly.

The second feature of the shown embodiment of the present invention is that when parallel process is to be performed, arithmetic operation common to a plurality of parallel Galois field constant multiplication performed in the syndrome calculation and the error position and error value calculation can be made common to significantly reduce circuit scale and power consumption in comparison with the prior art.

In the foregoing embodiment, discussion has been given for the decoding circuit of Read-Solomon code as one kind of BCH code. However, the decoding circuit of general BCH code may also be realized with similar circuit construction as the decoding circuit of the Read-Solomon code. Accordingly, the embodiment of the present invention is generally applicable for BCH code.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings:

FIG. 4 is an illustration showing an output format of a (i)th order syndrome coefficient updating signal $UP_i$ in the preferred embodiment of the present invention;

FIG. 11 is an illustration showing a frame format of first and second received code word in another embodiment of the present invention;

FIG. 12 is an illustration showing an output format of the (i)th order syndrome coefficient updating signal $UP_i$ in another embodiment of the present invention;

DESCRIPTION OF THE PREFERRED EMBODIMENT

The present invention will be discussed hereinafter in detail in terms of the preferred embodiment of a decoding circuit and a decoding method thereof according the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structure are not shown in detail in order to avoid unnecessary obscurity of the present invention.

Figure 1:
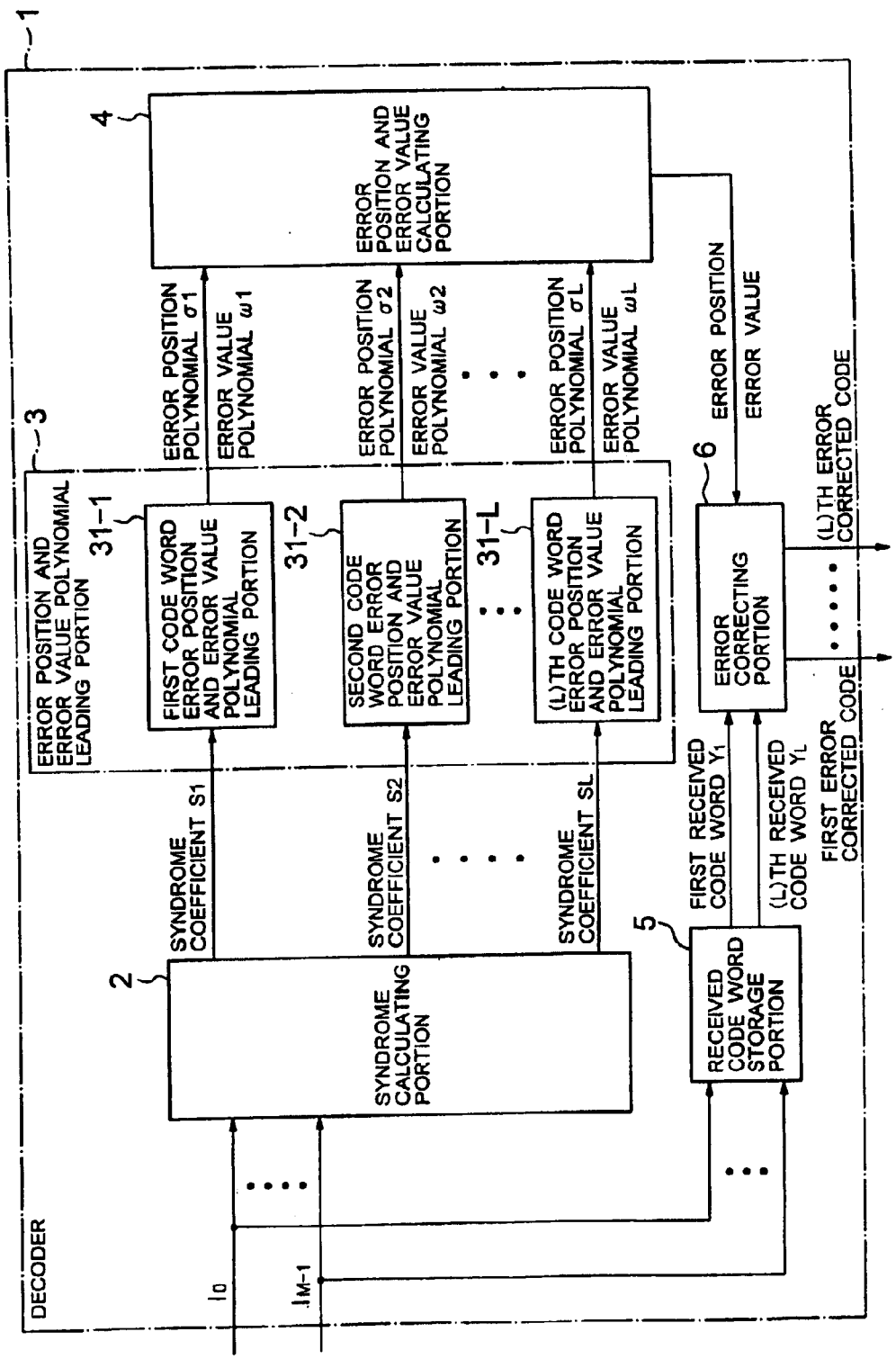
FIG. 1 is a block diagram showing a construction of a preferred embodiment of a decoding circuit according to the present invention.

FIG. 1 is a block diagram showing a construction of a preferred embodiment of a decoding circuit according to the present invention. It should be noted that, in discussion for operation of the preferred embodiment of the decoding circuit, reference is made to a flowchart in FIG. 21. In FIG. 1, the decoder 1 represents a Read-Solomon decoding circuit, in which a plurality of code words are processed using a single decoder. Hereinafter, it is assumed that a code word number is L, a code length is N blocks, a redundant inspection length is K blocks, a number of parallel processes is M and a Galois field primitive polynomial order number is D. It should be noted that when the code length N is not divisible with the parallel process number M, an auxiliary signal is added to the leading end of the code word. The auxiliary signal length P is the least natural number to make (N+P) divisible with M. The value of the auxiliary signal is initially set to zero. In the following disclosure, discussion will be given for the case where parallel process is to be performed. However, parallel process is not essential.

The decoder 1 is constructed with a syndrome calculating portion 2, an error position polynomial and error value polynomial leading portion 3, an error position and error value calculating portion 4, a received code word storing portion 5 and an error correcting portion 6. It should be noted that the error position polynomial and error value polynomial leading portion 3 is constructed with first to (L)th code word error position polynomial and error value polynomial leafing portions 31-1 to 31-L.

Figure 21:
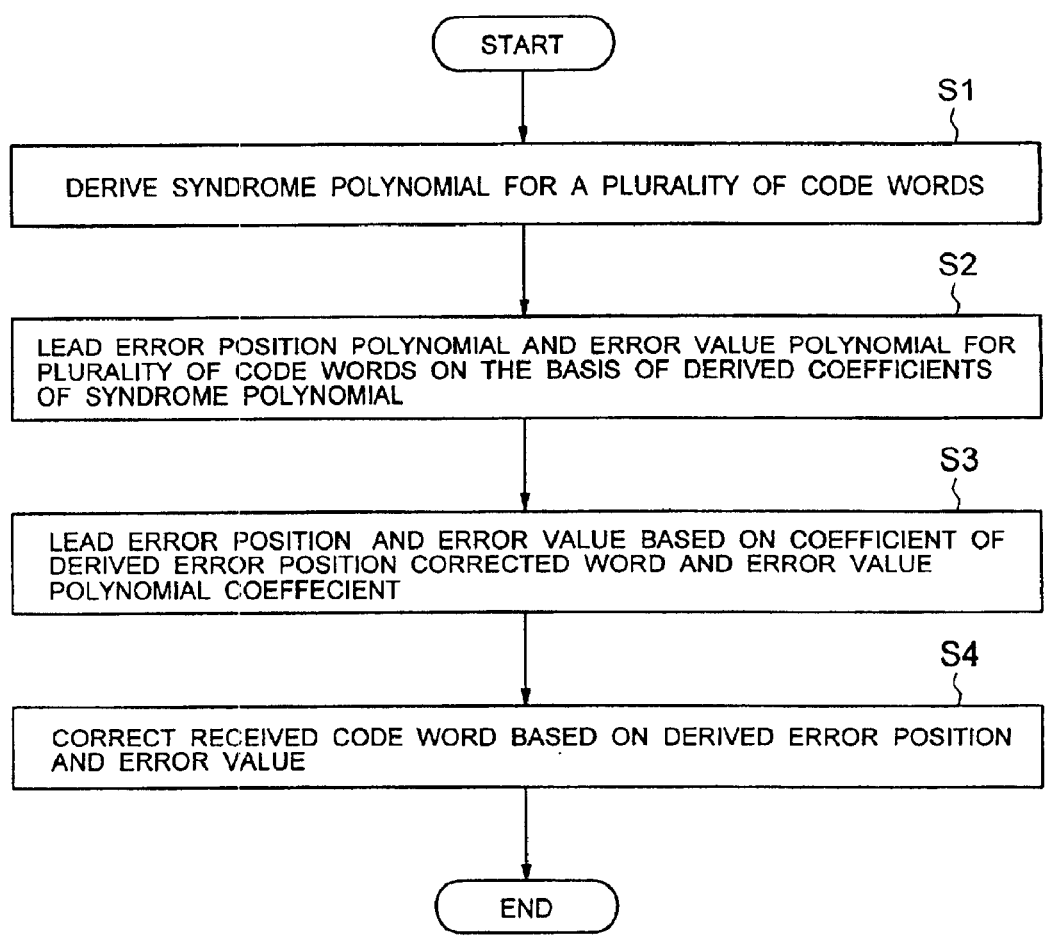
FIG. 21 is a flowchart showing operation of the shown embodiment of the decoding circuit according to the present invention.

The syndrome calculating portion 2 derives first to (L)th code word syndrome polynomial S1 to SL (step S1 of FIG. 21). The syndrome polynomial S1 of the first code word and its coefficient $S1_0$ to $S1_{K-1}$ are defined by the foregoing expressions (8) and (9).

Since the expression (9) can be modified to (10), in order to sequentially calculate the syndrome coefficient with respect to the received code word $Y1_j$, calculation may be progressed with the expression (11). Since the present invention performed M in number of parallel process, pre-process is performed with the expression (12) to update the syndrome coefficient sequentially as expressed in the expression (6). On the other hand, the second to (L)th code word syndrome polynomial S2 to SL is also derived in the similar manner as the syndrome polynomial S1.

Figure 2:
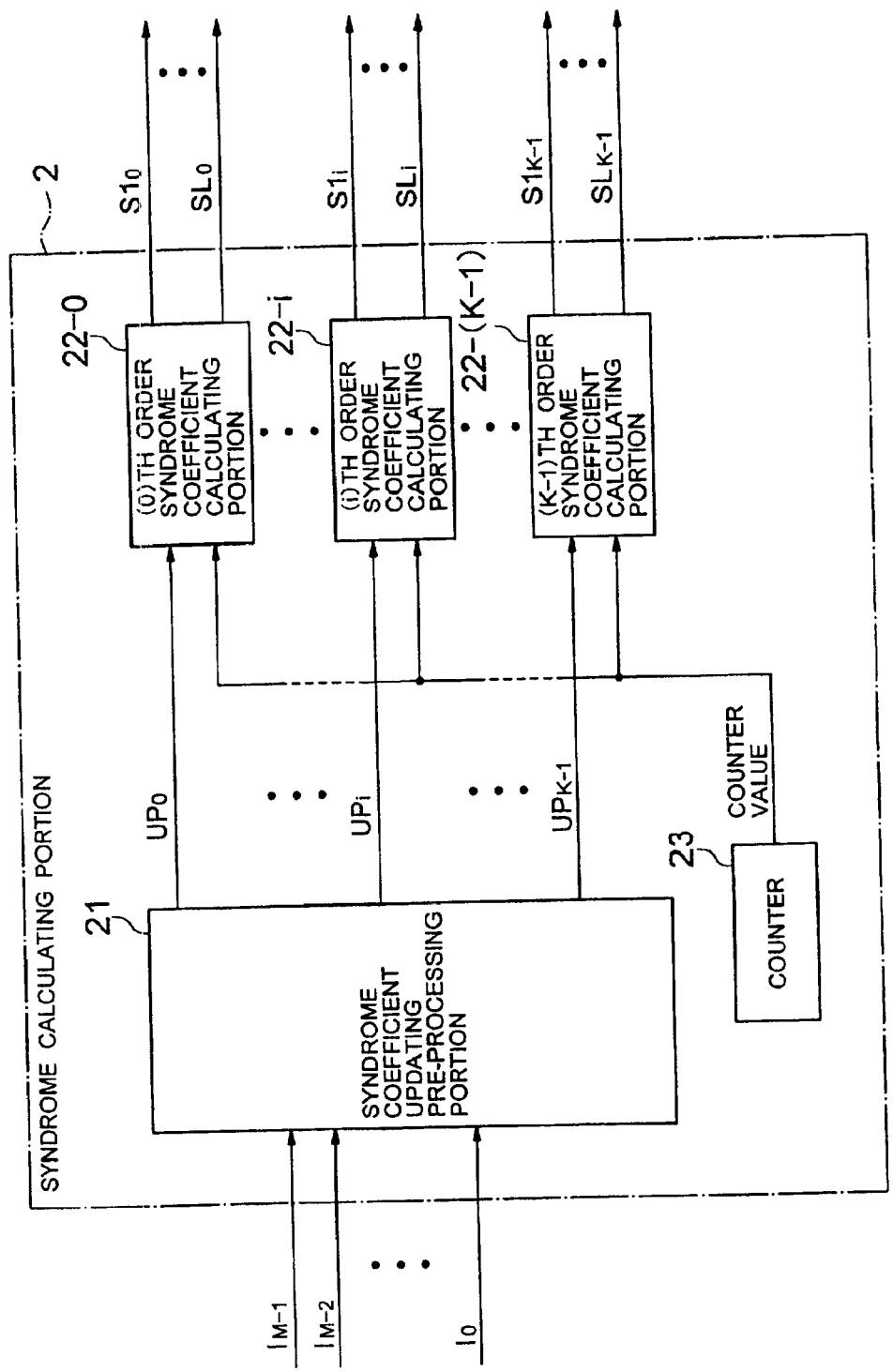
FIG. 2 is a block diagram showing a construction of a syndrome calculating portion of FIG. 1.
Figure 3:
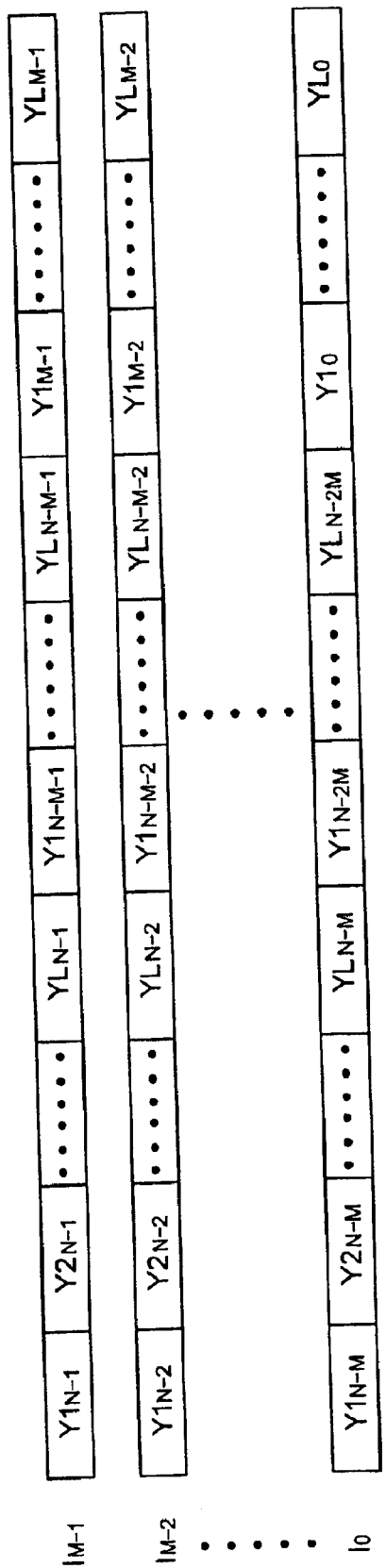
FIG. 3 is an illustration showing a frame format of a received code word in the preferred embodiment of the present invention.
Figure 4:
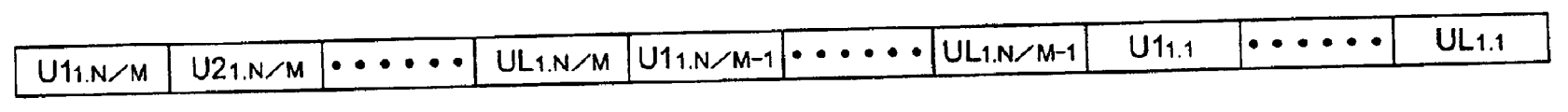

FIG. 2 is a block diagram showing a construction of a syndrome calculating portion 2 of FIG. 1, FIG. 3 is an illustration showing a frame format of a received code word in the preferred embodiment of the present invention, and FIG. 4 is an illustration showing an output format of a (i)th order syndrome coefficient updating signal $UP_i$ in the preferred embodiment of the present invention.

In FIG. 2, the syndrome calculating portion 2 is constructed with (0)th to (K−1)th order syndrome coefficient calculating portion 22-0 to 22-(K−1) and a syndrome coefficient updating pre-processing portion 21.

The first to (L)th received code words are input according to a frame format illustrated in FIG. 3. In the drawings, $YL_j$ represents a (j)th order component of the first code word and $YL_j$ is the (j)th order component of the (L)th code word.

In the shown embodiment, in order to process the L in number of code words simultaneously, the first to (L)th code words are input to the syndrome calculating portion 2 in sequential order from higher order component (descending order). Namely, in the first L clocks, (N−1)th component to (N−M)th component ($Y1_{N-1}, \ldots, Y1_{N-M}$), . . . , ($YL_{N-1}, \ldots, YL_{N-M}$) of the first to (L)th code are input , and in the next L clocks, (N−M−1)th component to (N−2M) component of the first to (L)th code words ($Y1_{N-M-1}, \ldots, Y1_{N-2N}$), . . . , ($YL_{N-M-1}, \ldots, YL_{N-2M}$) are input. M in number of parallel input signals are named as $I_{M-1}, I_{M-2}, \ldots, I_0$ from higher order component (descending order).

The M parallel input signals $I_{M-1}, I_{M-2}, \ldots, I_0$ are input to the syndrome coefficient updating pre-processing portion 21 in synchronism with the clock. The syndrome coefficient updating pre-processing portion 21 performs pre-process expressed in the expression (12).

Particularly, for the M parallel input signals $I_{M-1}, I_{M-2}, \ldots, I_0$, the processes expressed by the expressions (14.0) to (14.K−1) to output (0)th to (K−1)th order syndrome coefficient updating signals $UP_i$ (i=0, . . . , K−1) to the (0)th to (K−1)th order syndrome coefficient calculating portion 22-0 to 22-(K−1). Output format of the (i)th order syndrome coefficient updating signal $UP_i$ is shown in FIG. 4.

Considering the input signal $I_{M-1}$, the input signal $I_{M-1}$ performs (K−1) in number of Galois field constant multiplying operation during process of expressions (14.0) to (14.K−1). One Galois filed constant multiplication can be realized by a combined circuit of D bit input and D bit output.

However, in the present invention, (K−1) in number of Galois filed constant multiplication is realized by a combined circuit of the D bit inputs and D*(K−1) bit outputs. In case of the combined circuit of the D bit inputs and D*(K−1) bit outputs, arithmetic operation common to (K−1) in number of Galois filed constant multiplication can be used in common. Thus, circuit scale and power consumption can be significantly reduced in comparison with the combined circuit of the (K−1) in number of D bit inputs and D bit outputs.

When the leading end component ($Y1_{N-1}, \ldots, Y1^{N-M}$) of the first received code word is input, the counter 23 reset to zero. Subsequently, the counter 23 increments the counter value per clock. The counter 23 outputs the counter value to the (0)th to (K−1)th order syndrome coefficient calculating portion 22-0 to 22-(K−1). The (0)th to (K−1)th order syndrome coefficient calculating portion 22-0 to 22-(K−1) calculates the syndrome coefficients according to the expression (13) in sequential order.

Figure 5:
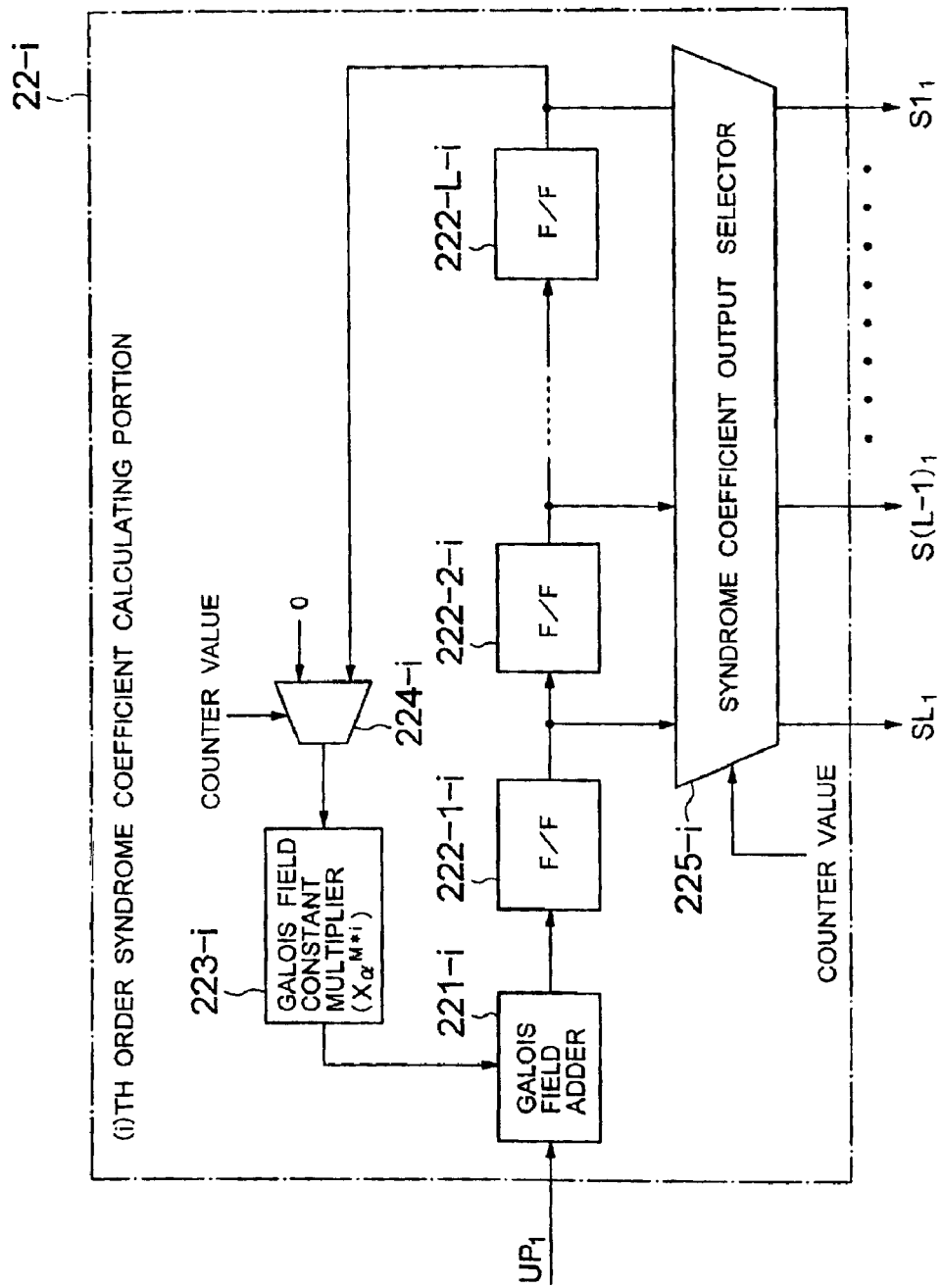
FIG. 5 is a block diagram showing a construction of the (i)th order syndrome coefficient calculating portion of FIG. 2.

FIG. 5 is a block diagram showing a construction of the (i)th order syndrome coefficient calculating portion 22-i of FIG. 2. In FIG. 5, the (i)th syndrome coefficient calculating portion 22-i is constructed with a Galois filed adder 221-i, first to (L)th stage feedback shift registers 222-1-i to 222-L-i, a Galois field constant multiplier 223-i, a Galois field constant multiplier input signal selector 224-i and a syndrome coefficient output selector 225-i. It should be noted that while not illustrated, the (0)th to (K−1)th order syndrome coefficient calculating portion 22-0 to 22-(K−1) have similar operation as the (i)th syndrome coefficient calculating portion 22-i.

When the counter value is 0 to L−1, the Galois field constant multiplier input signal selector 224-i outputs zero, and if the counter value is out of the range of 0 to L−1, the output of the (L)th stage feedback shift register 222-L−1 is output to the Galois field constant multiplier 223-i.

The Galois field constant multiplier 223-i multiplies the input signal by a constant ($\alpha^i$) to output to the Galois filed adder 221-i. The Galois filed adder 221-i takes the (i)th order syndrome coefficient updating signal UP$_i$ and the output of the Galois field constant multiplier input signal selector 224-i as inputs to output the result of addition to the first stage feedback shift register 222-1-i. The first to (L)th stage feedback shift registers 222-1-i to 222-L-i shifts the content of the shift register per clock.

When the counter value is in a range of 0 to L−1, the Galois field constant multiplier input signal selector 224-i outputs zero, and the Galois field constant multiplier 223-i also outputs zero. In this case, the Galois filed adder 221-i outputs the (i)th order syndrome coefficient updating signals UPi to the first stage feedback shift register 222-1-I as it is.

Accordingly, when the counter value is L, UL$_{i,N/W}$ is stored in the first stage feedback shift register 222-1-i and U1$_{i,N/M}$ is stored in the (L)th stage feedback shift register 222-L-i. When the counter value is L, the Galois field constant multiplier input signal selector 224-i outputs the output of the (L)th stage feedback shift register 222-L-i to the Galois field constant multiplier 223-i.

The output U1$_{i,N/M}$ of the (L)th stage feedback shift register 222-L-i multiplied by the constant ($\alpha^i$) by the Galois field constant multiplier 223-i is summed with the input signal U1$_{iN/M-1}$ in the (i)th Galois filed adder 221-i. The result of addition is output to the first stage feedback shift register 222-1-i. When the counter value is L+1, the content of the shift register of the first stage feedback shift register 222-1-i is updated.

In this case, the content UL$_{i,N/M}$ stored in the first stage feedback shift register 222-1-i is shifted to the second stage feedback shift register 222-2-i. The foregoing process is nothing but the process of the expression (13). The foregoing process is repeated until the next frame is input. When the leading end of the frame is input, the syndrome coefficients SL to S1 of the former frame are stored in the first to (L)th stage feedback shift registers 222-1-i to 222-L-i.

When the counter value is 0, the syndrome coefficient output selector 225-i outputs the outputs of the first to (L)th stage feedback shift registers 222-1-i to 222-L-i to the error position polynomial and error value polynomial leading portion 3 as the syndrome coefficient SL to S1. In the present invention, by employing the L stage feedback shift registers, a syndrome coefficient updating loop of the first to (L)th received code word are processed once with L in number of clocks.

Figure 22:
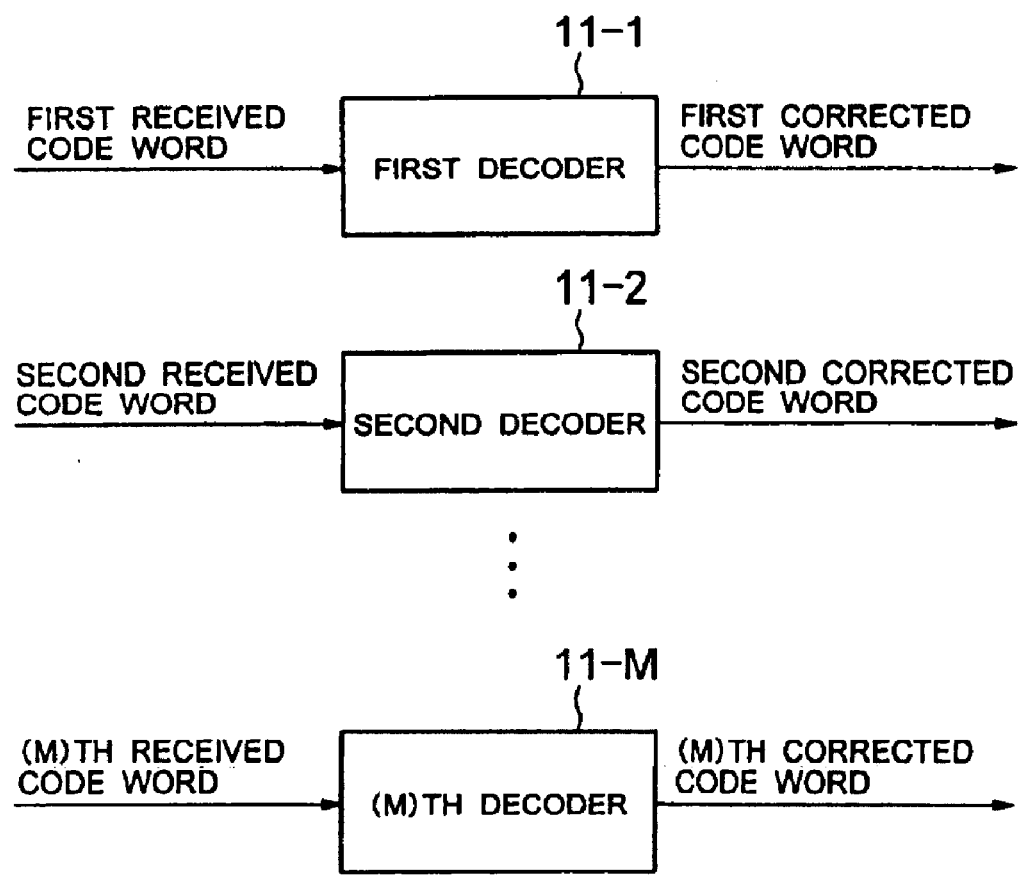
FIG. 22 is an illustration showing a construction of the system in a case where the system decoding L in number of code words are decoded simultaneously using the prior art.
Figure 23:
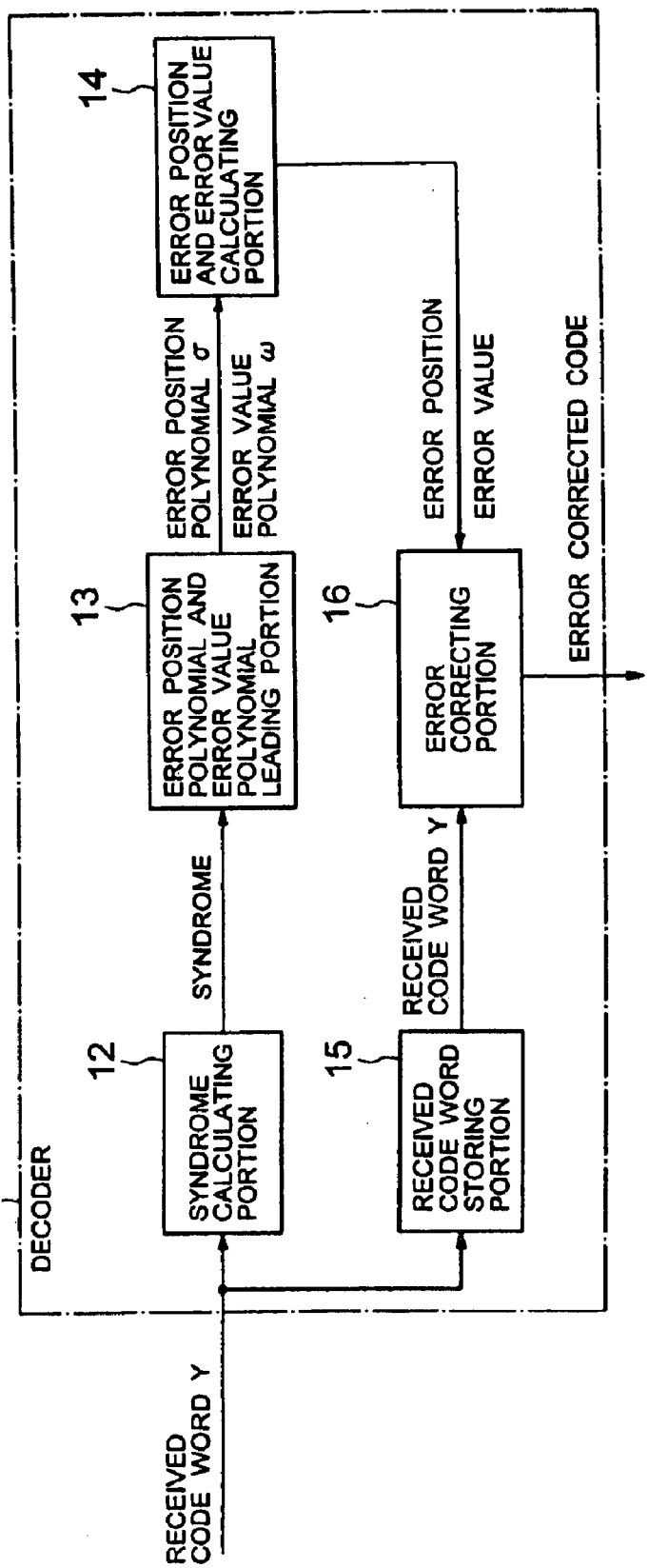
FIG. 23 is a block diagram showing a construction of the first to (M)th decoders.
Figure 24:
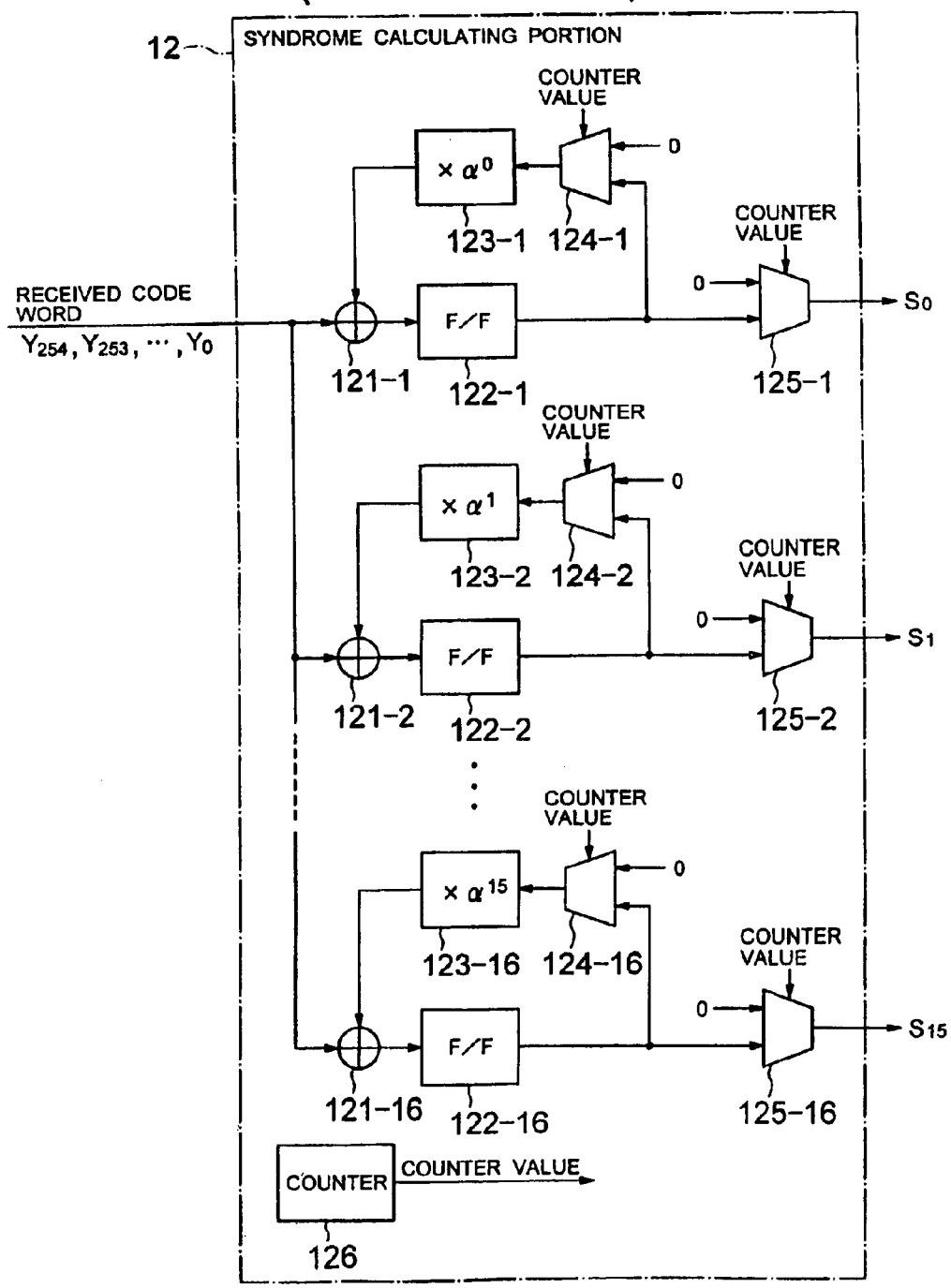
FIG. 24 is a block diagram showing a construction of the syndrome calculating portion of FIG. 23.
Figure 25:
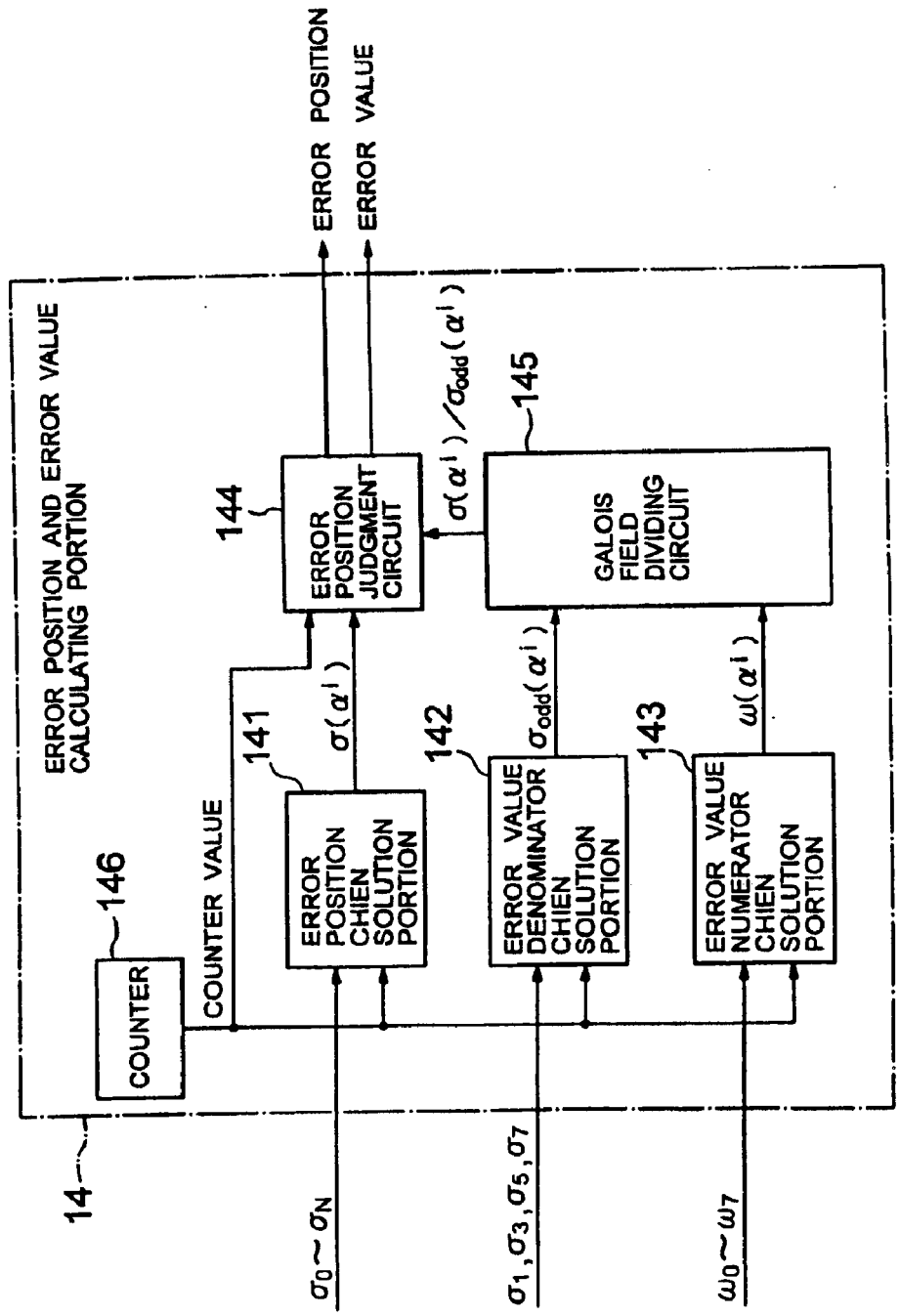
FIG. 25 is a block diagram showing a construction of the error position and error value calculating portion of FIG. 23.
Figure 26:
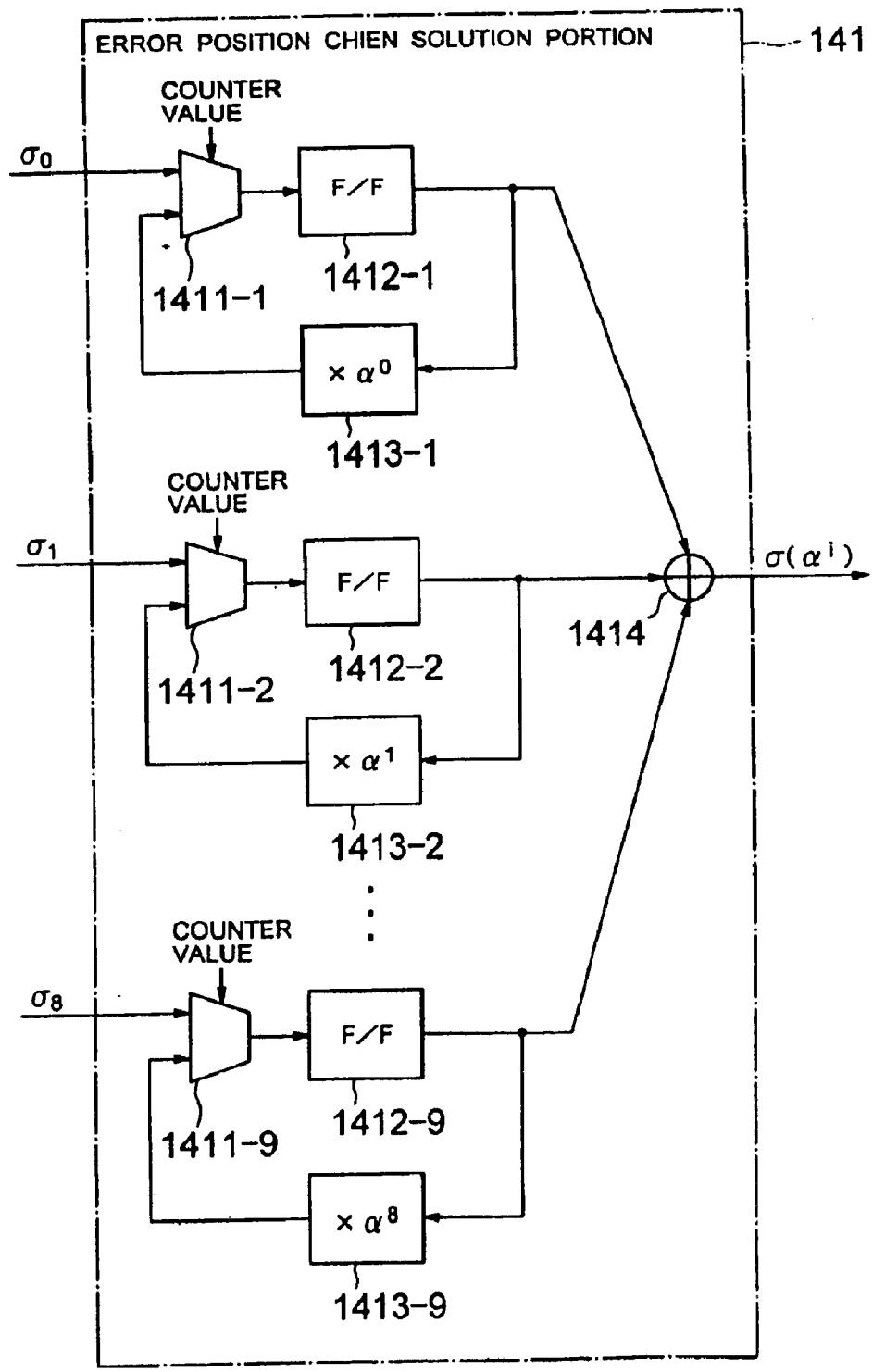
FIG. 26 is a block diagram showing a construction of error position Chien solution portion of FIG. 25.

The syndrome calculating portion 2 performs Galois field constant multiplication of M*(K−1) times. The L in number of the syndrome calculation portion in the prior art performs Galois field constant multiplication of L*(K−1) times (refer to FIG. 22). When the number of code word L and the number of parallel process M are the same, the syndrome calculating portions of the prior art and the present invention can be realized by the same clock frequency. The same is true for the Galois filed constant multiplication number.

However, in the present invention, in the syndrome coefficient updating pre-processing portion 21, by making common Galois filed constant multiplication in common, scale of the circuit can be reduced.

When parallel process is not performed, the syndrome calculating portion 2 can realize syndrome calculation of L code words only by adding L−1 in number of shift registers for the conventional syndrome calculating portion. Then, scale of the circuit can be reduced significantly.

The error position polynomial and error value polynomial leading portion 3 is constructed with first to (L)th code word error position polynomial and error value polynomial leading portion 31-1 to 31-L. In the first to (L)th code word error position polynomial and error value polynomial leading portion 31-1 to 31-L, respective syndrome coefficients S1 to SL are input as shown in FIG. 1.

The first to (L)th code word error position polynomial and error value polynomial leading portion 31-1 to 31-L lead first to (L)th code word error position polynomial σ1 to σL and first to (L)th error value polynomial ω1 to ωL using Euclid algorithms to output to the error position and error value calculating portion 4 (step S2 of FIG. 21). The first code word error position polynomial σ1 and the first code word error value polynomial ω1 are defined by the expressions (15) and (16). Euclid algorithms has been disclosed in the above-identified reference.

The error position and error value calculating portion 4 leads the error position and error value from the error position polynomial coefficient and the error value polynomial coefficient to output to the error correcting portion 6 (step S3 of FIG. 21). Here, the error value denominator polynomial σ$_{odd}$ which is derived by extracting odd number order component from the error position polynomial σ, is lead. A first code word error value denominator polynomial σ1$_{odd}$ is defined by the expression (17). Similarly, the second to (L)th code word error value denominator polynomials σ2$_{odd}$ to σL$_{odd}$ can be defined in the similar manner as the first code word error value denominator polynomial σ1$_{odd}$.

Powers $\alpha^j$ (j=1, . . . , N) is replaced in the first code word error position polynomial σ1 sequentially. When σ($\alpha^j$)=0, it can be appreciated that error is caused in (N−j)th order component Y1$_{N-j}$ of the first received code word. Thus, such method for deriving a solution by sequentially replacing powers of σ($\alpha^j$) is referred to as Chien solution. The theoretical background of capability of leading the error position from the error position polynomial has been disclosed in the above-identified reference. The relevant portion of the disclosure in the reference is herein incorporated by reference for the sake of disclosure.

On the other hand, the error value caused in the (N−j)th order component Y$_{N-j}$ is expressed by ω1($\alpha^j$)/σ1$_{odd}$($\alpha^j$). A numerator of error value (ω1($\alpha^j$)) and error value denominator (σ$_{odd}$($\alpha^j$)) are derived by using Chien solution.

Figure 6:
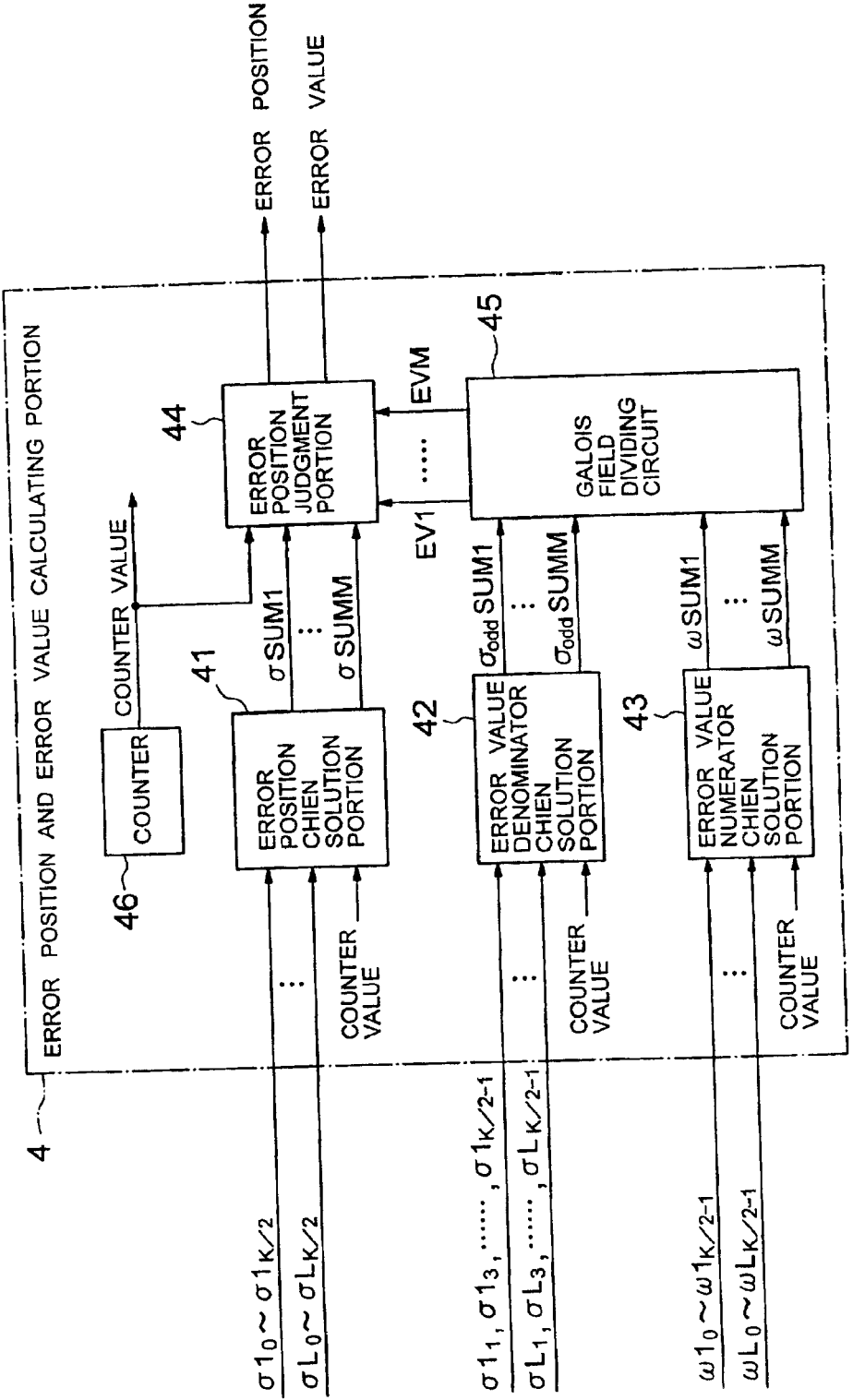
FIG. 6 is a block diagram showing c construction of an error position and error value calculating portion of FIG. 1.

FIG. 6 is a block diagram showing c construction of an error position and error value calculating portion of FIG. 1. In FIG. 6, the error position and error value calculating portion 4 is constructed with an error position Chien solution portion 41, an error value denominator Chien solution portion 42, an error value numerator Chien solution portion 43, an error position judgment circuit 44, a Galois field division circuit 45 and a counter 46.

The counter 46 is responsive to inputting of the error position polynomial coefficients σ1 to σL and the error value polynomial coefficients ω1 to ωL to be reset to zero. Subsequently, the counter 46 is incremented the counter value per clock.

Figure 7:
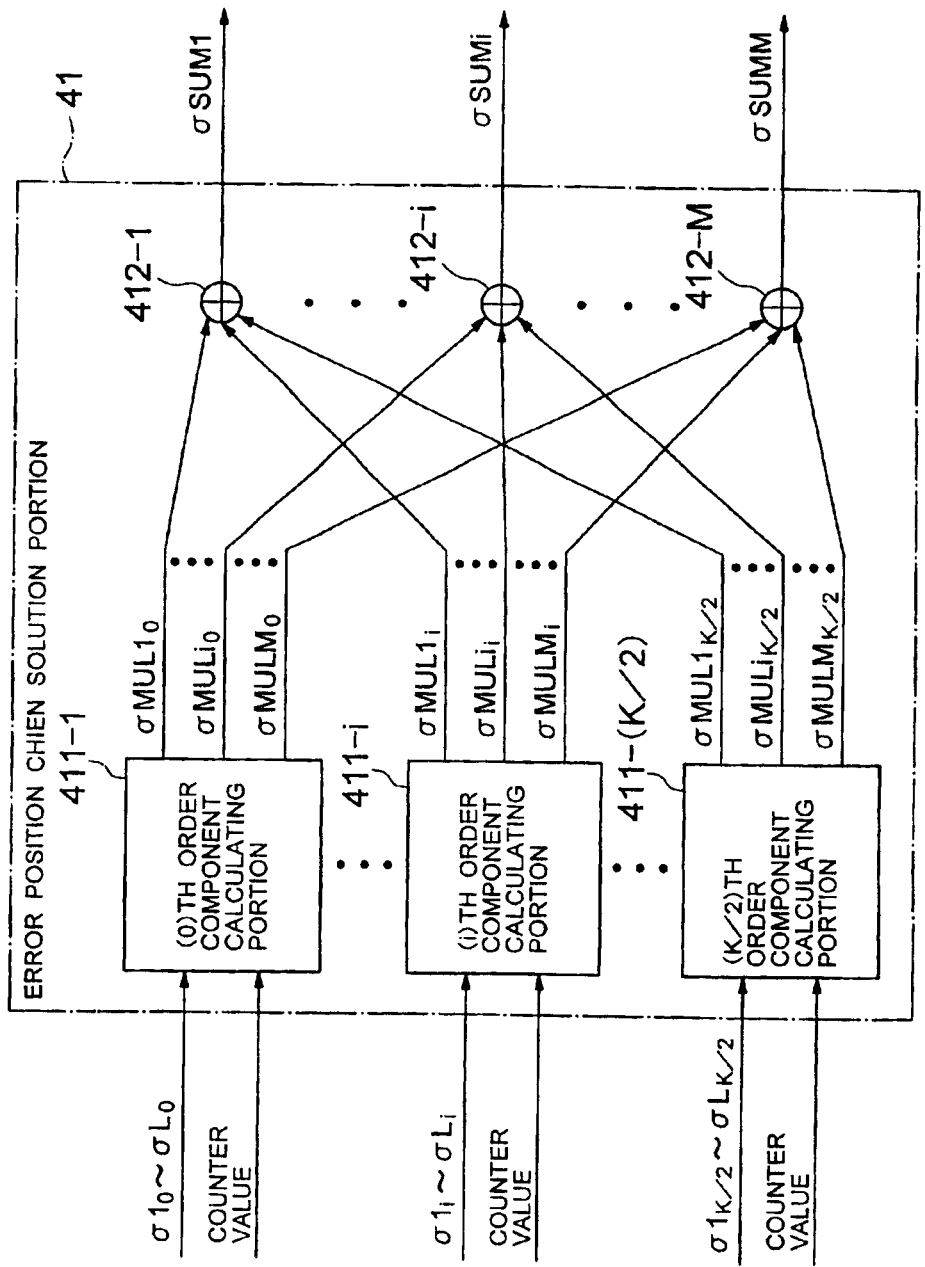
FIG. 7 is a block diagram showing a construction of an error position Chien solution portion of FIG. 6.

FIG. 7 is a block diagram showing a construction of an error position Chien solution portion 41 of FIG. 6. In FIG.

7, the error position Chien solution portion 41 is constructed with (0)th to (K/2)th order component calculating portions 411-1 to 411-(K/2) and first to (M)th Galois field adders 412-1 to 412-M.

Figure 8:
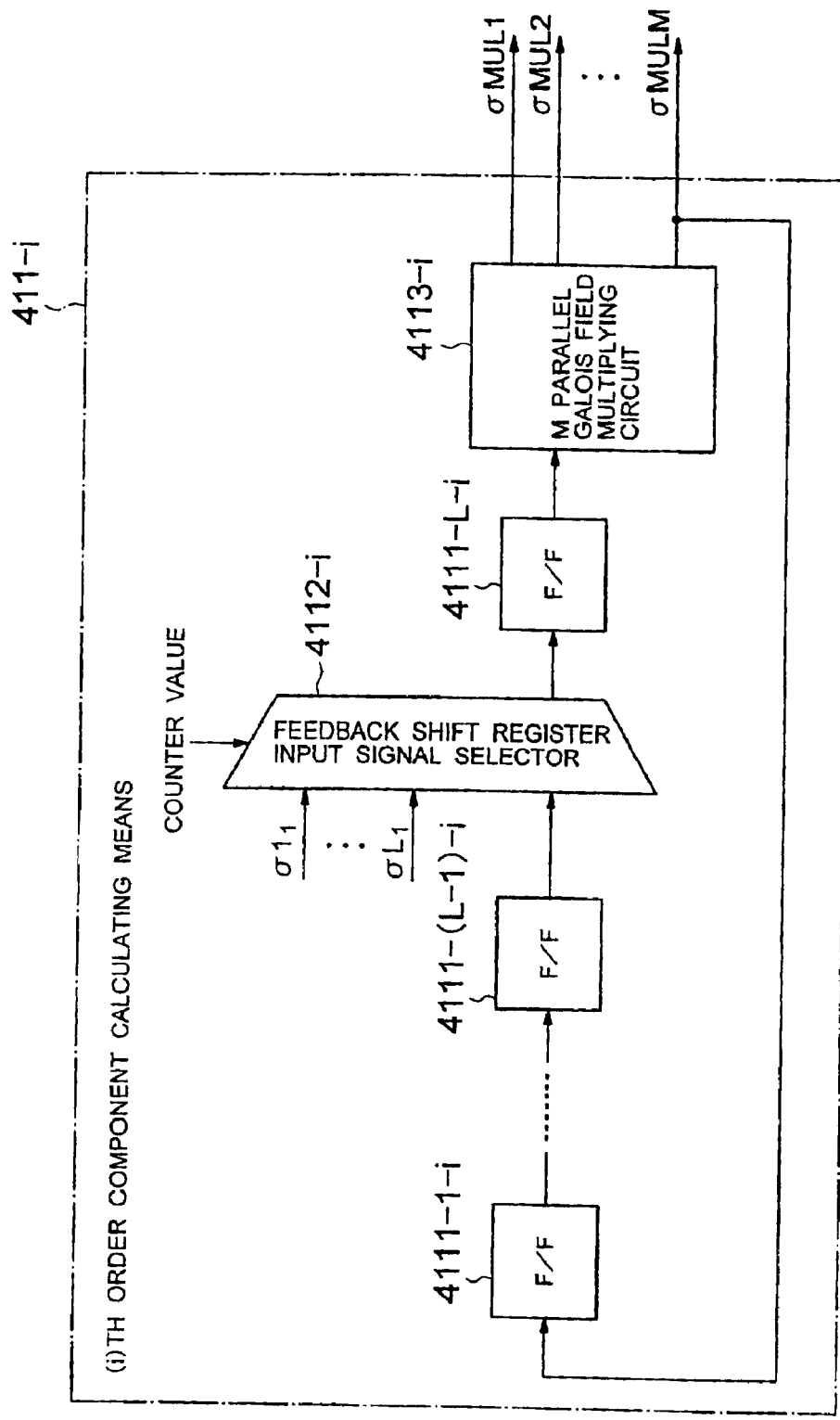
FIG. 8 is a block diagram showing a construction of the (i)th order component calculating portion of FIG. 7.

FIG. 8 is a block diagram showing a construction of the (i)th order component calculating portion 411-i of FIG. 7. In FIG. 8, the (i)th order component calculating portion 411-i is constructed with first to (L)th stage feedback shift registers 4111-1-i to 4111-L-i, feedback shift register input signal selectors 4112-i and a M parallel Galois field multipliers 4113-i. It should be noted that while not illustrated, (0)th to (K/2)th order component calculating portions 411-1 to 411-(K/2) have the same components and operation similar to the (i)th order component calculating portion 411-i.

Using FIGS. 7 and 8, discussion will be given for operation of the error position Chien solution portion 41. When the counter value is 0 to (L−1), the feedback shift register input signal selector 4112-i is sequentially output the first to (L)th code word (i)th order error position polynomial coefficients $\sigma 1_i$ to $\sigma L_i$ to the (L)th stage feedback shift register 4111-L-i.

When the counter value is out of a range of 0 to L−1, the feedback shift register input signal selector 4112-i outputs the output of the (L−1)th stage feedback shift register 4111-(L−1)-i to the (L)th stage feedback shift register 4111-L-i. The (L)th stage feedback shift register 4111-L-i delays the input signal for one clock to output to the M parallel Galois field multiplier 4113-i.

Assuming that the input signal of the M parallel Galois field multiplier 4113-i is INMULT, the M parallel Galois filed multiplier 4113-i performs processes shown in the expressions (18-1) to (18-M) to output σMUL1i to σMULMi to the first to (M)tyh Galois filed adders 412-1 to 412-M.

One Galois field constant multiplication can be realized by a combined circuit of D bit inputs and D bit outputs. The M parallel Galois field multiplier 4113-i performs M in number of Galois field constant multiplication can be realized by M in number of combined circuits, each having D bit inputs and D bit outputs.

However, in the shown embodiment of the present invention, the M parallel Galois field multiplier 4113-i is realized by a combined circuit of D bit inputs and D*M bit outputs. In this case, arithmetic operation common to M in number of Galois field constant multiplication can be made common to significantly reduce circuit scale and power consumption.

Output σMULMi of the M parallel Galois field multipliers 4113-i is branched into two and is also output to the first stage feedback shift register 411-1-i. The first to (L)th stage feedback shift registers 4111-1-i to 4111-L-i shift the content of the shift register per clock. When the counter value is 1, σMULMi becomes $\sigma 1_i * \alpha^{M*i}$. The value $\sigma 1_i * \alpha^{M*i}$ is shifted through the first to (L)th stage feedback shift registers 4111-1-i to 4111-L-i. When the counter value is L+1, σMULMi is input to the M parallel Galois field multiplier 4113-i. At this time, σMULMi becomes $\sigma 1_i * \alpha^{2*M*i}$.

Similarly, when the counter value is L, the output σMULMi becomes $\sigma 1_i * \alpha^{M*i}$. When the count value is 2*L, the output σMULMi becomes $\sigma L_i * \alpha^{2*M*i}$. In the shown embodiment of the present invention, by employing (L) stage of feedback shift register, L in number of code words are processed by L clocks. When the counter value is J*L+C (C=1, ..., L), the output of the M parallel Galois field multiplier 4113-i is expressed by expressions (19-1) to (19-M).

The (i)th Galois field adder 412-i inputs σMULi$_0$ to σMULi$_{K/2}$ output from the (0)th to (K/2)th order component calculating portions 411-i to 411-(K/2) to output the result of sum σSUMi to the error position judgment circuit 44.

Similarly, the first to (M)th Galois field adders 412-1 to 412-M outputs the results of addition σSUM1 to σSUMM to the error position judgment circuit 44. When the counter value is J*L+C (C=1, ..., L), the sums σSUM1 to σSUMM are expressed by the expressions (20-1) to (20-M).

The error value denominator Chien solution portion 42 inputs coefficients $(\sigma 1_1, \sigma 1_3, \ldots, \sigma 1_{k/2-1})$ to $(\sigma L_1, \sigma L_3, \ldots, \sigma L_{K/2-1})$ of the first to (L)th code word error value denominator polynomials $\sigma 1_{odd}$ to $\sigma L_{odd}$ to output $\sigma_{odd}$SUM1 to $\sigma_{odd}$SUMM to the Galois field division circuit 45. When the counter value is J*L+C (C=1, ..., L), $\sigma_{odd}$SUM1 to $\sigma_{odd}$SUMM are expressed by the expressions (21-1) to (21-M).

The error value numerator Chien solution portion 43 inputs coefficients $(\omega 1_1, \omega 1_3, \ldots, \omega 1_{k/2-1})$ to $(\omega L_1, \omega L_3, \ldots, \omega L_{K/2-1})$ of the first to (L) th code word error value polynomials ω1 to ωL to output ωSUM1 to ωSUMM to the Galois field division circuit 45. When the counter value is J*L+C (C=1, ..., L), ωSUM1 to ωSUMM are expressed by the expressions (22-1) to (22-M).

From expressions (20-1) to (20-M), (21-1) to (21-M) and (22-1) to (22-M), the error value denominator Chien solution portion 42 and the error value numerator Chien solution portion 43 can be realized by similar architecture as the error position Chien solution portion 41.

The Galois filed division circuit 45 performs division of ωSUM1 to ωSUMM and $\omega_{odd}$SUM1 to $\omega_{odd}$SUMM to output the result of division EV1 to EVM to the error position judgment circuit 44. When the counter value is J*(L+C) (C=1, ..., L), the result of division EV1 to EVM are expressed by (23-1) to (23-M).

The error position judgment circuit 44 makes judgment of the error position from the input signals σSUM1 to σSUMM. From the expressions (20-1) to (20-M), (23-1) to (23-M), when the counter value is J*L+C (C=1, ..., L) and σSUMi=0, judgment can be made that error of the error value EVi is caused in the (N−M*J)th order component YC$_{N-M*J}$ the (C)th code word. At this time, the error position judgment circuit 44 outputs the error position N−M*J and the error value EV1 to the error correction circuit 6.

The error position and error value calculating portion 4 performs Galois filed constant multiplication for (5K/4−1)*M times. The L in number of error position and error value calculating portion in the prior art performs Galois filed constant multiplication of (5K/4−1)*L times. When the number of code words L and number of parallel processes M are the same, the syndrome calculating portions in the prior art and the present invention can be realized at the same clock frequency, and number of times of Galois field constant multiplication also becomes the same.

However, in the shown embodiment, in the error position Chien solution portion 41, the error value denominator Chien solution portion 42 and the error value numerator Chien solution portion 43, arithmetic operation common to a plurality of Galois field constant multiplication can be made common to significantly reduce circuit scale and power consumption.

When parallel process is not performed, the error position and error value calculating portion 4 can realize syndrome calculation of L code words only by adding L−1 in number of shift registers for the conventional syndrome calculating portion.

The error position and the error value are lead from the error position polynomial coefficient and the error value polynomial coefficient are output to the error correcting portion 6. The error correcting portion 6 corrects the received code word stored in the received code word storing portion 5 on the basis of the error position and the error value input from the error position and error value calculating portion 4 to externally output the corrected code word (step S4 of FIG. 21).

It should be noted that while the decoders are assigned per the code word upon decoding a plurality of code words simultaneously in the prior art, the shown embodiment significantly reduces the circuit scale and the power consumption by decoding a plurality of code word simultaneously with single decoder 1.

The first feature of the shown embodiment of the present invention is that simultaneous decoding of L in number of code words can be realized by adding L−1 in number of shift registers in the syndrome calculating portion 2 and by adding L−1 in number of shift registers in the error position and error value calculating portion 4. Thus, circuit scale can be reduced significantly.

The second feature of the shown embodiment of the present invention is that when parallel process is to be performed, arithmetic operation common to a plurality of parallel Galois field constant multiplication performed in the syndrome calculation and the error position and error value calculation can be made common to significantly reduce circuit scale and power consumption in comparison with the prior art.

In the foregoing embodiment, discussion has been given for the decoding circuit of Read-Solomon code as one kind of BCH code. However, the decoding circuit of general BCH code may also be realized with similar circuit construction as the decoding circuit of the Read-Solomon code. Accordingly, the embodiment of the present invention is generally applicable for BCH code.

Figure 9:
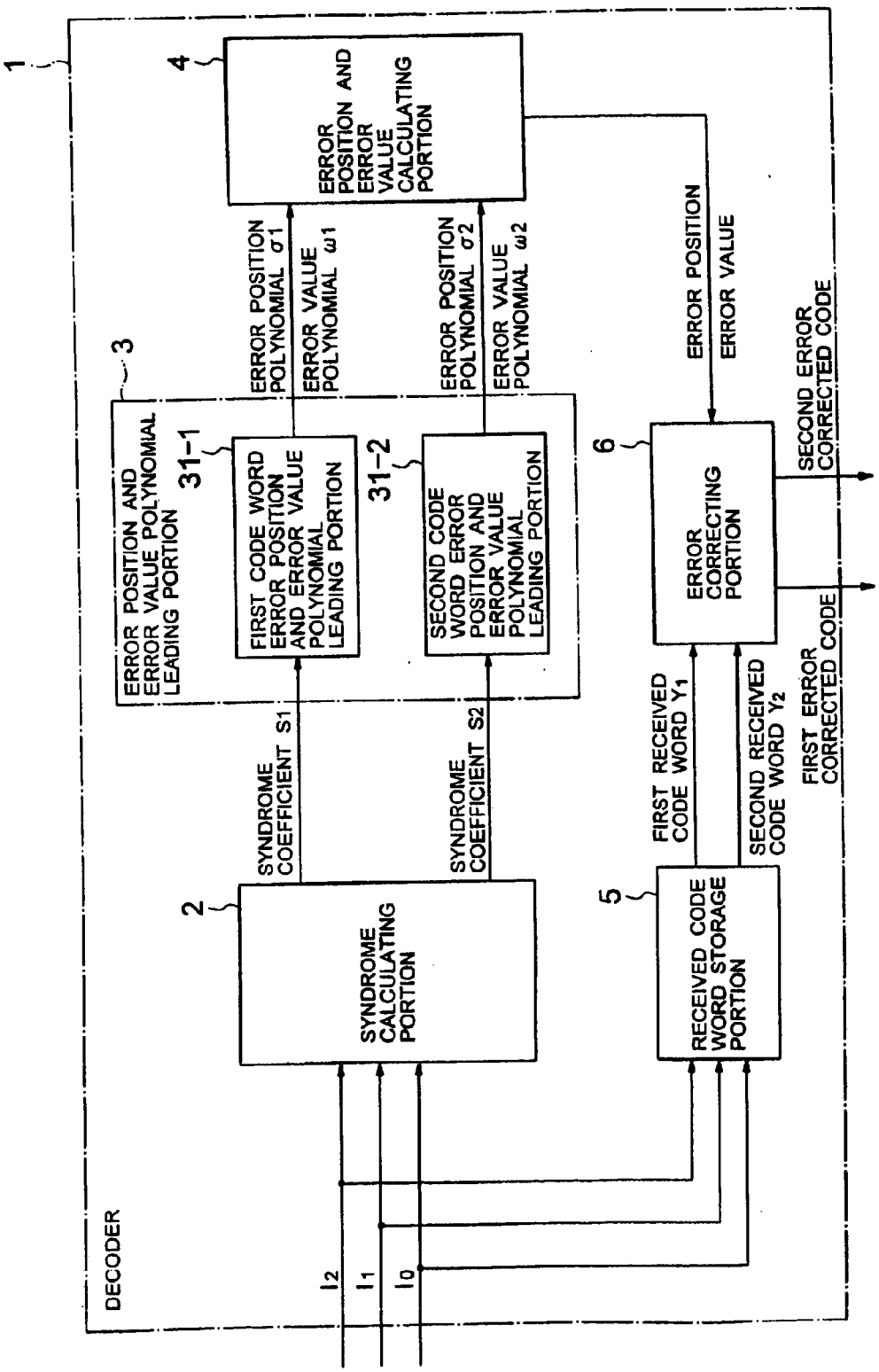
FIG. 9 is a block diagram showing a construction of another embodiment of the decoding circuit according to the present invention.

Next, another embodiment of the present invention will be discussed with reference to the drawings. FIG. 9 is a block diagram showing a construction of another embodiment of the decoding circuit according to the present invention. In FIG. 9, another embodiment of the decoding circuit according to the present invention is illustrated in terms of an example where the code length is 255 bytes, the redundant inspection signal is 16 bytes, the number of parallel processes is 3 and number of the code words is 2.

The decoder 1 is constructed with a syndrome calculating portion 2, an error position polynomial and error value polynomial leading portion 3, an error position and error value calculating portion 4, a received code word storing portion 5 and an error correcting portion 6. The decoder 1 receives first and second received code words to perform decoding process and output first and second corrected code words.

The syndrome calculating portion 2 takes the first and second received code words Y1 and Y2 and outputs coefficients $S1_0$ to $S1_{15}$ of the syndrome polynomial S1 of the first received code word Y1 and coefficients $S2_0$ to $S2_{15}$ of the syndrome polynomial S2 of the second received code word Y2.

Figure 10:
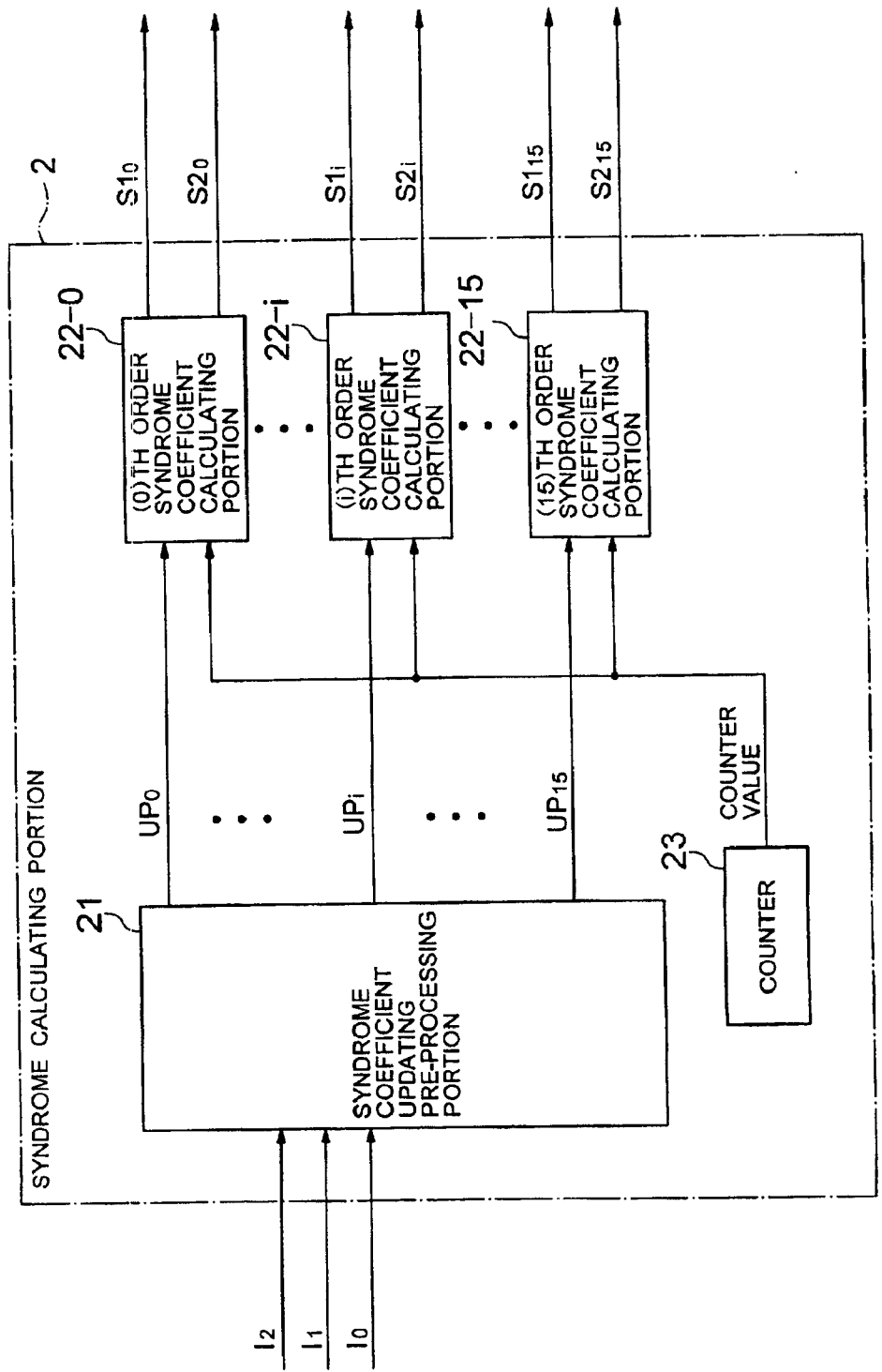
FIG. 10 is a block diagram showing a construction of the syndrome calculating portion of FIG. 9.

FIG. 10 is a block diagram showing a construction of the syndrome calculating portion 2 of FIG. 9. In FIG. 10, the syndrome calculating portion 2 is constructed with a (0)th to (15)th syndrome coefficient calculating portions 22-0 to 22-15, the syndrome coefficient updating pre-processing portion 21 and the counter 23.

Figure 12:
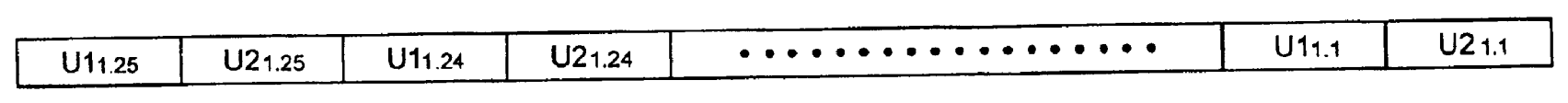

FIG. 11 is an illustration showing a frame format of first and second received code words Y1 and Y2 in another embodiment of the present invention, and FIG. 12 is an illustration showing an output format of the (i)th order syndrome coefficient updating signal $UP_i$ in another embodiment of the present invention. In FIG. 11, the first and second received code words Y1 and Y2 are input to the syndrome calculating portion 2 as three parallel signals $I_2$, $I_1$ and $I_0$.

The syndrome coefficient updating pre-processing portion 21 of the syndrome calculating portion 2 takes three parallel signals $I_2$, $I_1$ and $I_0$ as input and outputs (0)th to (15)th order syndrome updating signals $UP_i$ (i=0, . . . , 15) to the (0)th to (15)th syndrome coefficient calculating portions 22-0 to 22-15.

When the leading end component of the received code word is input, the counter 23 reset to zero. Subsequently, the counter 23 increments the counter value per clock. The counter 23 outputs the counter value to the (0)th to (15)th order syndrome coefficient calculation portion 22-0 to 22-15.

The (0)th to (15)th syndrome coefficient calculating portions 22-0 to 22-15 take the (0)th to (15)th syndrome coefficient updating signals $UP_0$ to $UP_{15}$ as input to output the syndrome coefficients $S1_0$ to $S1_{15}$ and $S2_0$ to $S2_{15}$.

Figure 13:
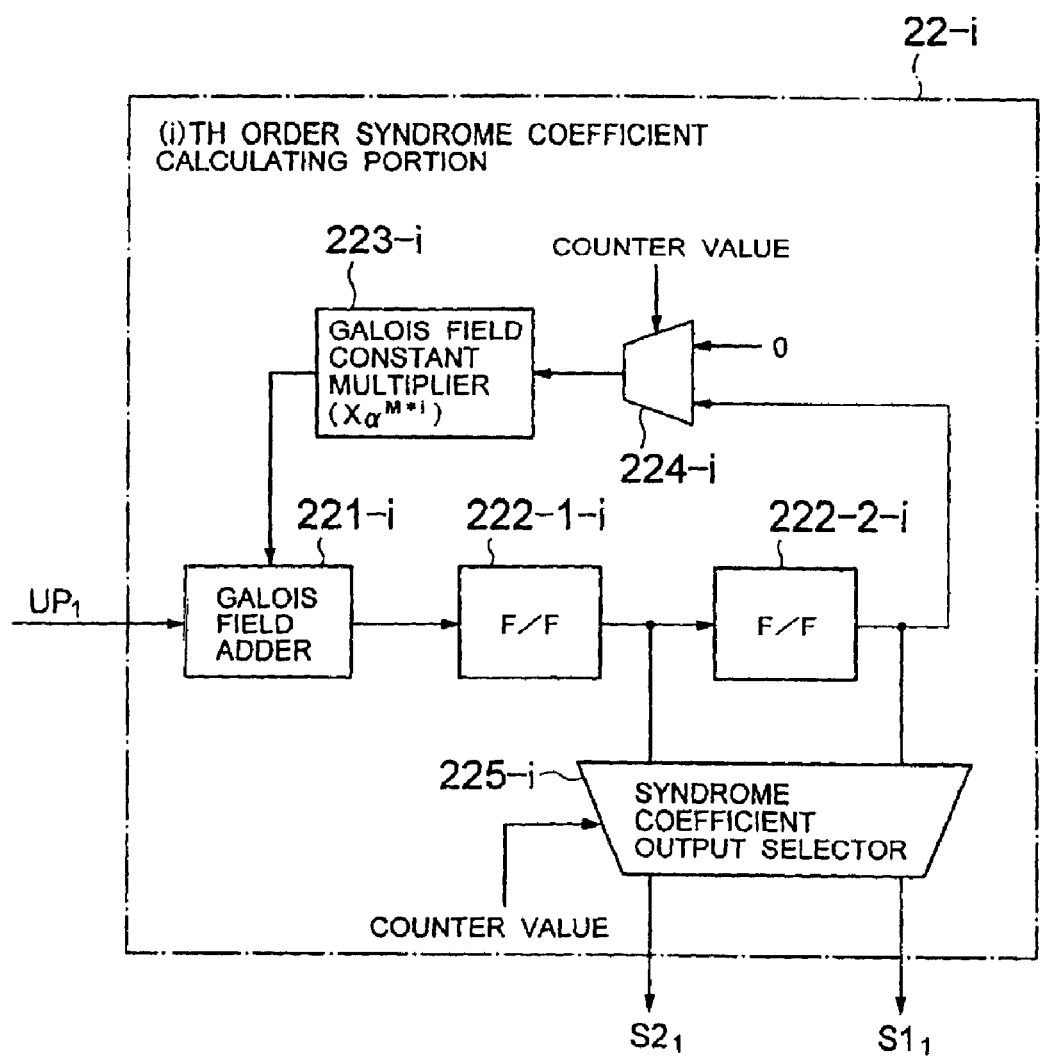
FIG. 13 is a block diagram showing a construction of the (i)th syndrome coefficient calculating portion of FIG. 10.

FIG. 13 is a block diagram showing a construction of the (i)th syndrome coefficient calculating portion 22-i of FIG. 10. In FIG. 13, the (i)th syndrome coefficient calculating portion 22-i is constructed with the (i)th Galois filed adder 221-i, the first stage feedback shift register 222-i, the second stage feedback shift register 223-i, the Galois field constant multiplier 225-i, the Galois field constant multiplier input signal selector 226-i and a syndrome coefficient output selector 227-i.

The (i)th Galois filed adder 221-i takes the (i)th order syndrome coefficient updating signal $UP_i$ and the output of the Galois field constant multiplier 225-I as input to output the result of addition to the first stage feedback shift register 222-i.

The first stage feedback shift register 222-i takes the output of the (i)th Galois filed adder 221-i as input to output to the second stage feedback shift register 223-i and the syndrome coefficient output selector 2227-i with a delay for one clock. The second stage feedback shift register 223-i takes the output of the first stage feedback shift register 222-i as input for outputting to the Galois field constant multiplier input signal selector 226-i.

The syndrome coefficient output selector 227-i takes the output of the first stage feedback shift register 222-i and the output of the second stage feedback shift register 223-i as input to output the syndrome coefficients S1 and S2 to the error position polynomial and error value polynomial leading portion 3.

The Galois field constant multiplier input signal selector 226-i takes the counter value and the output of the second stage feedback shift register 223-i and a constant 0 as input to select one of the output of the second stage feedback shift register 223-1 and the constant 0 to output to the Galois field constant multiplier 225-i.

The Galois field constant multiplier 225-i takes the output of the Galois field constant multiplier input signal selector 226-i as input to output the result of constant multiplication to the Galois field adder 221-i. It should be noted that, while not illustrated on the drawings, the (0)th to (15)th syndrome coefficient calculating portions 22-0 to 22-15 have similar construction and syndrome has the (i)th order syndrome coefficient calculating portion 22-i.

The error position polynomial and error value polynomial leading portion 3 is constructed with the first and second code word error position polynomial and error value polynomial leading portions 31-1.

The first code word error position polynomial and error value polynomial leading portion 31-1 takes the syndrome coefficients $S1_0$ to $S1_{15}$ as inputs to output the first code word error position polynomial $\sigma 1$ and the coefficients $\sigma 1_0$ to $\alpha\sigma 1_s$, $\omega 1_0$ to $\omega 1_7$ of the first code word error value polynomial $\omega 1$ to the error position and error value calculating portion 4.

The second code word error position polynomial and error value polynomial leading portion 31-2 takes the syndrome coefficients S20 to S25 as inputs to output the second code word error position polynomial $\sigma 2$ and the coefficients $\sigma 2_0$ to $\alpha\sigma 2_s$, $\omega 2_0$ to $\omega 2_7$ of the second code word error value polynomial $\omega 2$ to the error position and error value calculating portion 4.

The error position and error value calculating portion 4 takes the first code word error position polynomial $\sigma 1_0$ to $\sigma 1_s$, the first code word error value polynomial coefficient $\omega 1_0$ to $\omega 1_7$, the second code word error position polynomial $\sigma 2_0$ to $\sigma 2_7$ and the second code word error value polynomial coefficients $\omega 2_0$ to $\omega 2_7$ as input to output the error position and error value to the error correcting portion 6.

Figure 14:
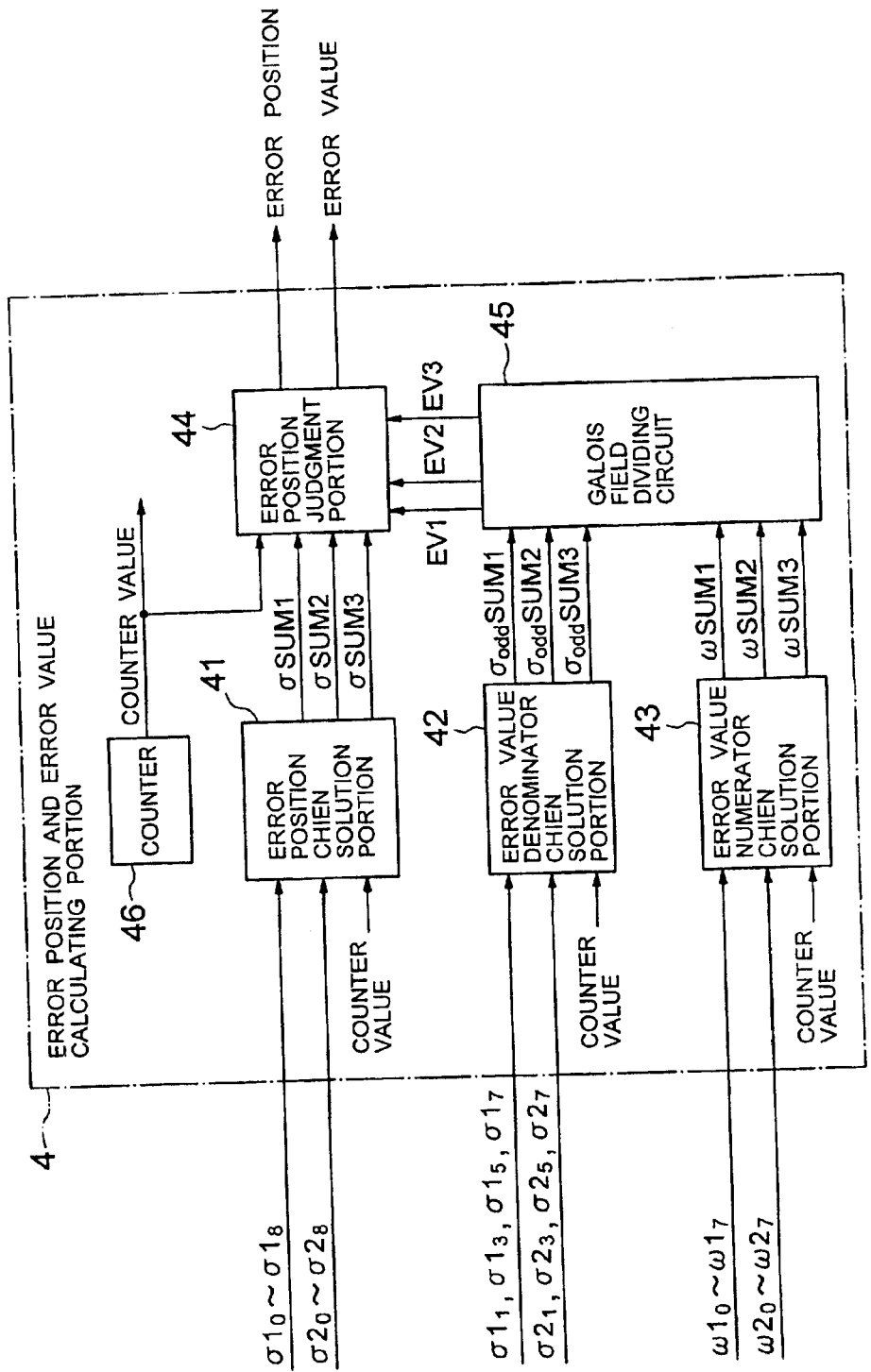
FIG. 14 is a block diagram showing a construction of the error position and error value calculating portion of FIG. 9.

FIG. 14 is a block diagram showing a construction of the error position and error value calculating portion of FIG. 9. In FIG. 14, the error position and error value calculating portion 4 is constructed with the error position Chien solution portion 41, the error value denominator Chien solution portion 42, the error value numerator Chien solution portion 43, the error position judgment portion 44, the Galois field division circuit 45 and the counter 46.

The counter 46 is responsive to input of the first code error position polynomial $\sigma 1_0$ to $\sigma 1_s$, the first code word error value polynomial coefficient $\omega 1_0$ to $\omega 1_7$, the second code error position polynomial $\sigma 2_0$ to $\sigma 2_s$ and the second code word error value polynomial coefficient $\omega 2_0$ to $\omega 2_7$, to be reset. Subsequently, the counter 46 is incremented the counter value per clock. The counter 46 outputs the counter value to respective error position Chien solution portion 41, the error value denominator Chien solution portion 42, the error value numerator Chien solution portion 43 and error position judgment portion 44.

The error position Chien solution portion 41 takes the first code error position polynomial $\sigma 1_0$ to $\sigma 1_s$ and the second code error position polynomial $\sigma 2_0$ to $\sigma 2_s$ as inputs and outputs arithmetic operation result $\sigma$SUM1 to $\sigma$SUM3 obtained by sequentially replacing the error position polynomials $\sigma 1$ and $\sigma 2$ powers of primitive element a sequentially, to the error position judgment portion 44.

Figure 15:
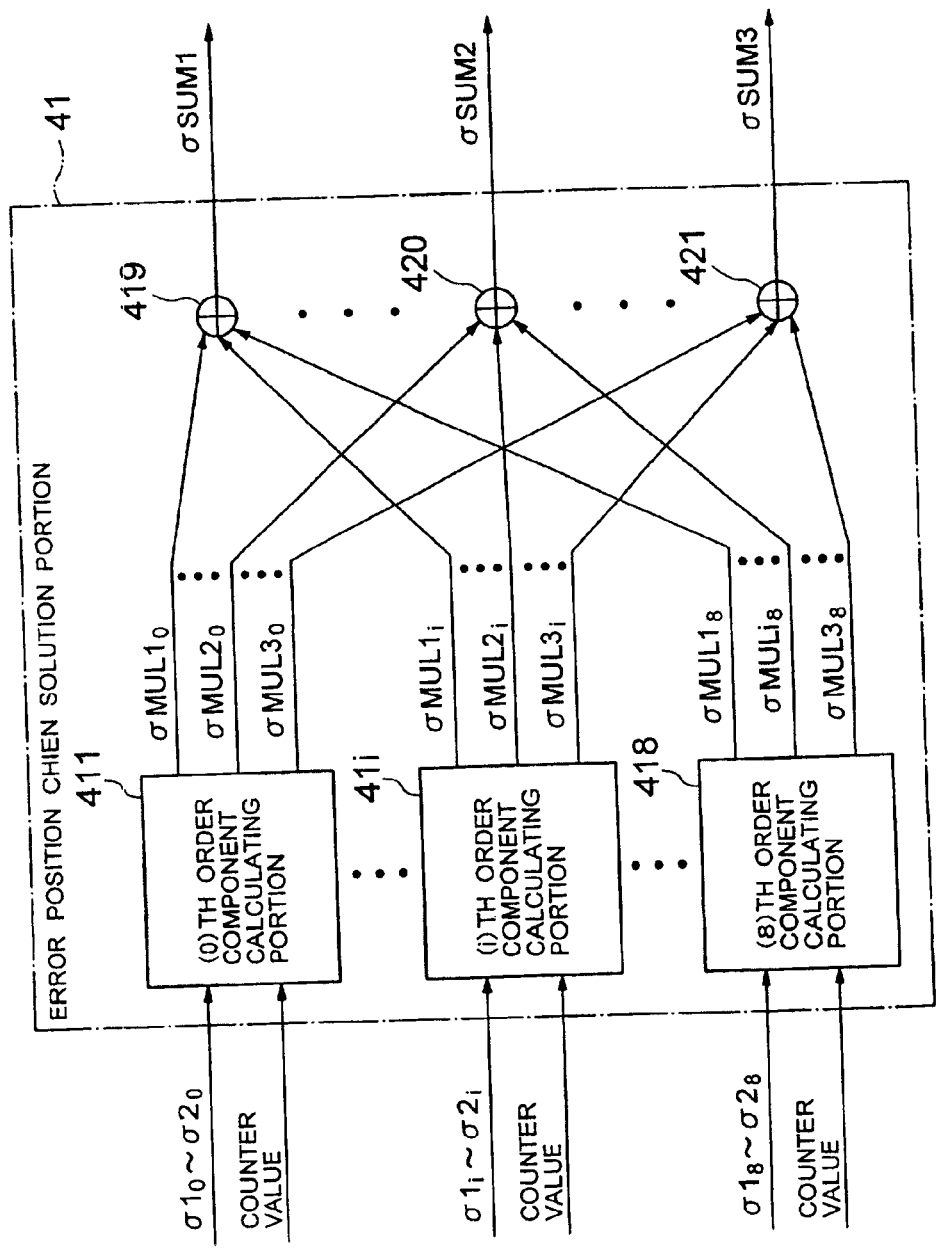
FIG. 15 is a block diagram showing a construction of an error position Chien solution portion of FIG. 14.

FIG. 15 is a block diagram showing a construction of an error position Chien solution 41 portion of FIG. 14. In FIG. 15, the error position Chien solution portion 41 is constructed with (0)th to (8)th order component calculating portions 411 to 418 and first to third Galois field adders 419 to 421.

Figure 16:
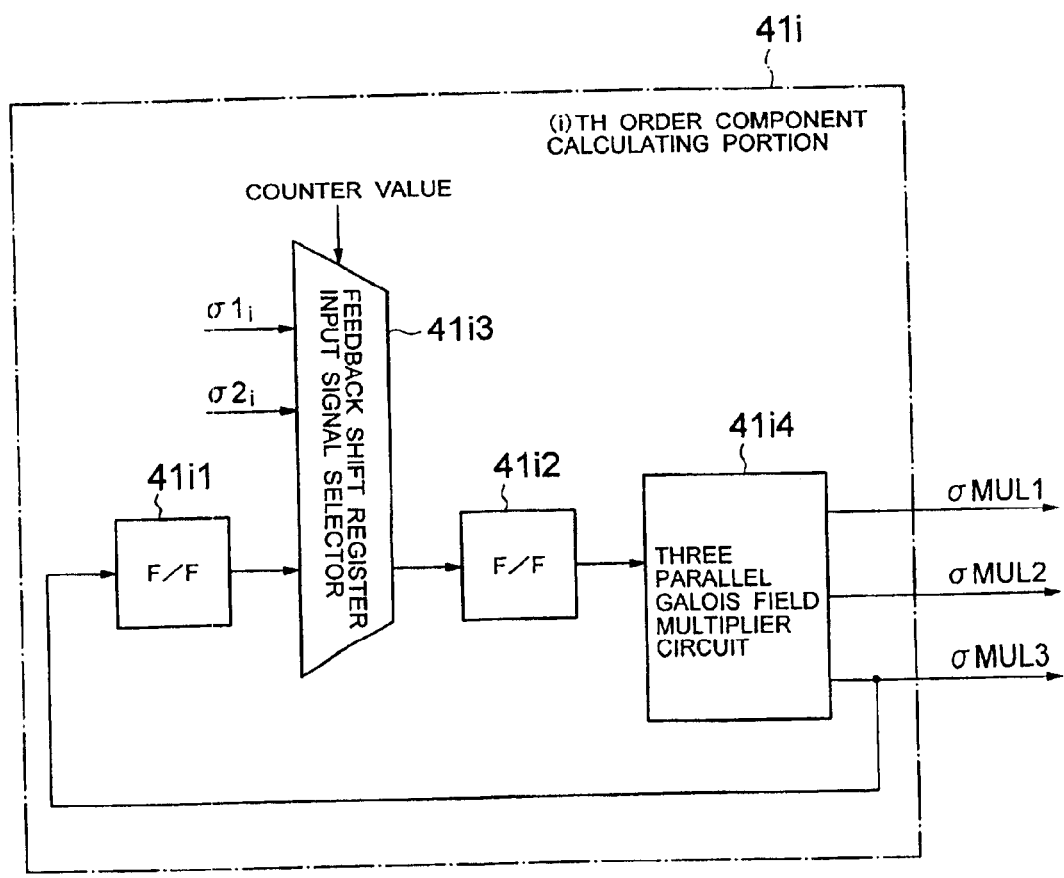
FIG. 16 is a block diagram showing a construction of the (i)th order component calculating portion of FIG. 15.

FIG. 16 is a block diagram showing a construction of the (i)th order component calculating portion 41$i$ of FIG. 15. In FIG. 16, the (i)th order component calculating portion 41$i$ is constructed with first and second feedback shift registers 41$i$1 and 41$i$2, a feedback shift register input signal selector 41$i$3 and a three parallel Galois field multiplier 41$i$4.

The feedback shift register input signal selector 41$i$3 takes the counter value, the (i)th components $\sigma 1_i$ and $\sigma 2_i$ of the error position polynomial coefficient of the first and second codewords and the outputs of first stage feedback shift register 41$i$1 as inputs, selects one of the input signals depending upon the counter value to output to the second stage feedback shift register 41$i$2.

The second stage feedback shift register 41$i$2 takes the output of the feedback shift register input signal selector 41$i$3 as input to output to the three parallel Galois field multiplier 41$i$4 with delay for one clock.

The three parallel Galois filed multiplier 41$i$4 takes the output of the second stage feedback shift register 41$i$2 as input to perform three Galois field constant multiplication to output results of multiplication $\sigma$MULT1$_i$ to $\sigma$MULT3$_i$ to the first to third Galois field adders 419 to 421. $\sigma$MULT3 is branched into two and is also input to the first stage feedback shift register 41$i$1.

The first feedback shift register 41$i$1 delays the input signal $\sigma$MULT3$_i$ for one clock to output to the feedback shift register input signal selector 41$i$3. It should be noted that while not illustrated, the (0)th to (8)th component calculating portions 411 to 418 have similar construction and operation as the (i)th order component calculating portion 41$i$.

The first Galois field adder 419 takes the output of $\sigma$MULT1$_0$ to $\sigma$MULT1$_8$ of the (0)th to (8)th component calculating portions 411 to 418 as inputs to output the result of addition $\sigma$SUM1 to the error position judgment portion 44. The second Galois field adder 420 takes the outputs $\sigma$MULT2$_0$ to $\sigma$MULT2$_8$ of the (0)th to (8)th component calculating portions 411 to 418 as input to output the result of addition $\sigma$SUM1 to the error position judgment portion 44. The second Galois field adder 420 takes the outputs $\sigma$MULT2$_0$ to $\sigma$MULT2$_8$ of the (0)th to (8)th component calculating portions 411 to 418 as input to output the result of addition $\sigma$SUM2 to the error position judgment portion 44. The third Galois field adder 421 takes the outputs $\sigma$MULT3$_0$ to $\sigma$MULT3$_8$ of the (0)th to (8)th component calculating portions 411 to 418 as input to output the result of addition $\sigma$SUM3 to the error position judgment portion 44.

The error value denominator Chien solution portion 42 takes the counter value and odd number order coefficients $\sigma 1_1$, $\sigma 1_3$, $\sigma 1_5$, $\sigma 1_7$, $\sigma 2_1$, $\sigma 2_3$, $\sigma 2_5$, $\sigma 2_7$ of the error position polynomial as input to output the result of arithmetic operations $\sigma_{odd}$SUM1 to $\sigma_{odd}$SUM3 obtained by sequentially replacing powers of the primitive element $\alpha$ to the odd number component of the error position polynomial to the Galois field division circuit 45.

The error value numerator Chien solution portion 43 takes the counter value and the error position polynomial coefficients $\omega 1_0$ to $\omega 1_7$ and $\omega 2_0$ to $\sigma\omega 2_7$ as input to output the result of arithmetic operation $\omega$SUM1 to $\omega$SUM3 obtained by sequentially replacing powers of primitive element $\alpha$ to the error position polynomial coefficient to the Galois field division circuit 45.

The Galois field division circuit 45 takes the outputs $\sigma_{odd}$SUM1 to $\sigma_{odd}$SUM3 of the error value denominator Chien solution portion 42 and the outputs $\omega$SUM1 to $\omega$SUM3 of the error value numerator Chien solution portion 43 as input to output the result of division EV1 to EV3 obtained by division to the error position judgment portion 44.

The error position judgment portion 44 derives the error position and the error value on the basis of the counter value, the outputs $\sigma$SUM1 to $\sigma$SUM3 of the error position Chien solution portion 41 and the outputs EV1 to EV3 of the Galois field division circuit 45 to output the error position and the error value to the error correction circuit 6.

The first and second received code words Y1 and Y2 are input to the received code word storage portion 5 as three parallel signals $I_2$, $I_1$ and $I_0$ according to the frame format shown in FIG. 11. The received code word storage portion 5 stores the input first and second received code words Y1 and Y2 until the error position and the error value are judged by the syndrome calculating portion 2, the error position polynomial and error value polynomial leading portion 3 and the error position and error value calculating portion 4. The stored first and second received code words Y1 and Y2 are output to the error correcting portion 6.

The error correcting portion 6 takes the error position and the error value output from the error position and error value calculating portion 4 and the first and second received code words Y1 and Y2 output from the received code word storage portion 5, to externally output as the first and second corrected code words.

Operation will be discussed in the case where the code length is 255 bytes, the redundancy inspection signal 16 bytes, the number of parallel processes is 3 and the number of the code words is 2 in another embodiment of the decoder 1 according to the present invention with reference to FIGS. 9 to 16.

It is assumed that the primitive polynomial of Galois field is $x^8+x^4+x^3+x^2+1$ and the primitive element is $\alpha$, the generated polynomial is expressed by:

$$G(x)=(x-1)(x-\alpha^2)\ldots(x-\alpha^{15}) \quad (24)$$

In FIG. 9, there is shown the shown embodiment of the Read-Solomon decoding circuit (decoder) 1 according to the present invention. In FIG. 9, the Read-Solomon decoding circuit 1 performed decoding process with taking the first and second received codewords as input to output first and second corrected code words.

The Read-Solomon decoding circuit 1 is constructed with the syndrome calculating portion 2, the error position polynomial and error value polynomial leading portion 3, the error position and error value calculating portion 4, the received code word storage portion 5 and the error correcting portion 6.

The syndrome calculating portion 2 takes the first and second received code words Y1 and Y2 as inputs to output coefficients $s1_0$ to $s1_{15}$ of the syndrome polynomial S1 of the first received code word Y1 and the coefficients $s2_0$ to $s2_{15}$ of the syndrome polynomial S2 of the second received code word Y2.

The coefficients $s1_0$ to $s1_{15}$ of syndrome polynomial S1 are respectively defined by:

$$S1_i = Y1(\alpha^i) \quad (25)$$
$$= Y1_0 + Y1_1\alpha^i + Y1_2\alpha^{2i} + \ldots + Y1_{254}\alpha^{254i}$$

wherein i=0 to 15

In the show embodiment, for sequentially calculating the syndrome coefficients defined by the following expressions (26) with respect to the first and second received code words Y1 and Y2 per three orders, the following calculation as expressed by the following expressions (27) are performed.

$$U1_{ij}=Y1_{3\cdot j-1}\alpha^{2\cdot i}+Y1_{3\cdot j-2}\alpha^i+Y1_{3\cdot (j-i)}$$
$$U2_{ij}=Y2_{3\cdot j-1}\alpha^{2\cdot i}+Y2_{3\cdot j-2}\alpha^i+Y2_{3\cdot (j-i)} \quad (26)$$
$$S1_i\leftarrow(S1_i\alpha^{3\cdot i}+U1_{ij})$$
$$S2_i\leftarrow(S2_i\alpha^{3\cdot i}+U2_{ij}) \quad (27)$$

i=0 to 15, j=85 to 1)

FIG. 10 shows a construction of the syndrome calculating portion 2. In FIG. 10, the syndrome calculating portion 2 is constructed with the (0)th to (15)th order syndrome coefficient calculating portions 22-0 to 22-15, the syndrome coefficient updating pre-process portion 21 and the counter 23.

The first and second received code words Y1 and Y2 arte input according to the frame format shown in FIG. 11. In the drawings, $Y1_j$ represents the (j)th order component of the first codeword. $Y2_j$ represents the (j)th order component of the second code word. In another embodiment of the second invention, in order to process two code words simultaneously, the first and second code words are input to the syndrome calculating portion 2 per 3 bytes from the higher order component in sequential order (descending order).

Namely, in the initial two clocks (254)th to (252)th components ($Y1_{254}$, $Y1_{253}$, $Y1_{252}$) and ($Y2_{254}$, $Y2_{253}$, $Y2_{252}$) of the first and second code words are input, then, in the next two clocks, (251)th to (249)th components of the first and second code words are ($Y1_{251}$, $Y1_{250}$, $Y1_{249}$) and ($Y2_{251}$, $Y2_{250}$, $Y2_{249}$) are input. Three parallel inputs are named ed $I_2$, $I_1$ and $I_0$ from higher order component (descending order).

The three parallel input signals I2, I1 and I0 are input to the syndrome coefficient updating pre-process portion 21 in synchronism with the clock. The syndrome coefficient updating pre-process portion 21 performs preliminary process as expressed by the foregoing expression (26). In particular, for the input signals $I_2$, $I_1$ and $I_0$, the following processes are performed.

$$UP_0=I_2+I_1+I_0 \quad (28.0)$$
$$UP_1=I_2\alpha^2+I_1\alpha+I0 \quad (28.1)$$
$$UP2=I_2\alpha^4+I_1\alpha^2+I0 \quad (28.2)$$

.

.

.

$$UP15=I_2\alpha^{30}+I_1\alpha^{15}+I0 \quad (28.15)$$

The (0)th to (15)th syndrome coefficient updating signal UPi (i=0, ..., 15) is output to the (0)th to (15)th order syndrome coefficient calculating portions 22-0 to 22-15. In FIG. 12, the output format of the (i)th syndrome coefficient updating signal UPi is shown.

Considering the input signal I2, for the input signal I2, fifteen Galois field constant multiplication is performed during process of expressions (28.0) to (28.15). The Galois field constants to be multiplied are $\alpha^2$, $\alpha^4$, $\alpha^6$, ..., $\alpha^{30}$. One Galois field constant multiplication can be realized by a combined circuit consisted of XOR (exclusive OR) having 8 bit input and 8 bit output. Assuming concerning the input signal of the 8 bit input and 8 bit output Galois field constant multiplier circuit, input signals are IB(7) to IB(0) and output signals are OB(7) to OB(0), multiplications of $\alpha^2$ are expressed by:

$$OB(7)=IB(5)$$
$$OB(6)=IB(4)$$
$$OB(5)=IB(3) \text{xor } IB(7)$$
$$OB(4)=IB(2) \text{xor } IB(6) \text{xor } IB(7)$$

$$OB(3)=IB(1) \text{xor } IB(6) \text{xor } IB(7)$$

$$OB(2)=IB(0) \text{xor } IB(6)$$

$$OB(1)=IB(7)$$

$$OB(0)=IB(6) \qquad (29)$$

On the other hand, multiplication of $\alpha^4$ are expressed by:

$$OB(7)=IB(3) \text{xor } IB(7)$$

$$OB(6)=IB(2) \text{xor } IB(6) \text{xor } IB(7)$$

$$OB(5)=IB(1) \text{xor } IB(5) \text{xor } IB(6) \text{xor } IB(7)$$

$$OB(4)=IB(0) \text{xor } IB(4) \text{xor } IB(5) \text{xor } IB(6)$$

$$OB(3)=IB(4) \text{xor } IB(5) \text{xor } IB(7)$$

$$OB(2)=IB(4) \text{xor } IB(6)$$

$$OB(1)=IB(5)$$

$$OB(0)=IB(4) \qquad (30)$$

Looking the expressions (29) and (23), it should be appreciated that there are some common arithmetic operations such as "IB(3)xor IB(7)"or so forth. Similarly, there are many common arithmetic operation during arithmetic operation of multiplication of fifteen elements of $\alpha^2$, $\alpha^4$, $\alpha^6$, ... $\alpha^{30}$, which can be realized by fifteen Galois field constant multiplication with the combined circuit consisted of XOR of 8 bit input and 8*15 bit output for significantly reducing circuit scale.

When the leading 3 bits ($Y1_{254}$, $Y1_{253}$, $Y1_{252}$) of the first received code word are input to the syndrome coefficient updating pre-process portion 21, the counter 23 is reset to 0. Subsequently, the counter 23 is incremented the counter value per clock. The counter 23 outputs the counter value to the (0)th to (15)th order syndrome coefficient calculating portions 22-0 to 22-15.

The (0)th to (15)th order syndrome coefficient calculating portions 22-0 to 22-15 sequentially calculate the syndrome coefficient according to the foregoing expression (27). In FIG. 13, construction of the (i)th syndrome coefficient calculating portion 22-i is shown. The (i)th syndrome coefficient calculating portion 22-i is constructed with first and second feedback shift registers 222-i and 223-i, the Galois field constant multiplier 225-i, Galois field constant multiplier input signal selector 226-i and syndrome coefficient output selector 227-i.

When the counter value is 0 to 1, the Galois field constant multiplier input signal selector 226-i outputs zero. When the counter value is other than 0 to 1, the output of the second feedback shift register 223-i is output to the Galois field constant multiplier 225-i. The Galois field constant multiplier 225-i multiplies the input signal for constant ($\alpha^i$) times to output to the Galois field adder 221-i.

The Galois field adder 221-i takes the (i)th order syndrome coefficient updating signal $UP_i$ input from the syndrome coefficient updating pre-process portion 21 and the output of the Galois field constant multiplier input signal selector 226-i to output the result of addition to the first feedback shift register 222-i. The first and second feedback shift registers 222-i and 223-i shift the contents of the shift registers per clock.

When the counter value is 0 to 1, the Galois field constant multiplier input signal selector 226-i outputs zero and the Galois field constant multiplier 225-i also outputs zero. In this case, the Galois field adder 221-i outputs the (i)th order syndrome coefficient updating signal $UP_i$ to the first stage feedback shift register 222-i as is.

Accordingly, when the counter value is 2, $U2_{1,85}$ is stored in the first stage feedback shift register 222-i, and $U1_{1,85}$ is stored in the second stage feedback shift register 223-i. When the counter value is 2, the Galois field constant multiplier input signal selector 226-i outputs the output $U1_{1,85}$ of the second stage feedback shift register 223-i to the Galois field constant multiplier 225-i.

The Galois field constant multiplier 225-i multiplies the output $U1_{1,85}$ of the second stage feedback shift register 223-i for ($\alpha^i$) times to output $U1_{1,85*\alpha i}$ to the Galois field adder 221-i. The Galois field adder 221-i adds the output $U1_{1,85*\alpha i}$ of the Galois field constant multiplier 225-i and the input signal $UP_i$ (=$U1i_{,84}$) to output the result of addition to the first stage feedback shift register 222-i. When the counter value is 3, the contents of the first stage feedback shift register 222-i is updated.

In this time, the contents $U2_{i,85}$ are shifted to the second stage feedback shift register 223-i. When the counter value is 3, the Galois field constant multiplier 225-i multiplies the output of the second stage feedback shift register 223-i for constant ($\alpha^i$) times to output $U2_{i,85}*\alpha^i$ to the Galois field adder 221-i.

The Galois field adder 221-i adds the output $U2_{i, 85}*\alpha^i$ and input signal $UP_i$ (=$U2i_{,84}$) to output the results of addition to the first stage feedback shift register 222-i.

The foregoing process is repeated unto the leading end of the next frame is input. The foregoing process is nothing other than the process of the expression (27). Accordingly, when the leading end of the frame is input, the syndrome coefficient $S2_i$ of the former frame is stored in the first stage feedback shift register 222-i, and the syndrome coefficient $S1_i$ of the former frame is stored in the second stage feedback shift register 223-i. When the counter value is 0, the syndrome coefficient output selector 227-i outputs the outputs of the first and second stage feedback shift registers 222-i and 223-i as the syndrome coefficients S1 to S2 to the error position polynomial and error value polynomial leading portion 3.

The error position polynomial and error value polynomial leading portion 3 is constructed with first and second code word error position polynomial and error value polynomial leading portions 31-1 and 31-2. To the first and second code word error position polynomial and error value polynomial leading portions 31-1 and 31-2, respective syndrome coefficients S1 to S2 are input as shown in FIG. 9.

The first and second code word error position polynomial and error value polynomial leading portions 31-1 and 31-2 lead the first and second code word error position polynomial σ1 and σ2 and the first and second code word error value polynomial ω1 and ω2 using Euclid algorithms and so forth respectively to output to the error position and error value calculating portion 4.

The first code word error position polynomial σ1 and the first code word value polynomial ω1 are defined as follows:

$$\sigma 1(z)=\sigma 1_0+\sigma 1_1 z+ \ldots +\sigma 1_8 z^8 \qquad (31)$$

$$\omega 1(z)=\omega 1_0+\omega 1_1 z+ \ldots +\omega 1_7 z^7 \qquad (32)$$

The error position and error value calculating portion 4 leads the error position and the error value from the error position polynomial coefficient and error value polynomial coefficient to output to the error correcting portion 6. Here, the error value denominator polynomial $\sigma_{odd}$ extracted the odd number order component from the error position polynomial σ is leaded.

The first code word error value denominator polynomial $\sigma 1_{odd}$ is expressed by:

$$\sigma 1_{odd}(z) = \sigma 1_1 z + \sigma 1_3 z^3 + \sigma 1_5 z^5 + \sigma 1_7 z^7 \qquad (33)$$

The second code word error value denominator polynomial $\sigma 2_{odd}$ is also expressed by, similarly to the first code word error value denominator polynomial $\sigma 1_{odd}$.

When error EV1 is caused in the (255−j)th component $Y1_{255-j}$ of the first received code word, the following expressions (34) and (35) are established:

$$\sigma 1(\alpha^j) = 0 \qquad (34)$$

$$EV1 = \omega 1(\alpha^j)/\sigma 1_{odd}(\alpha^j) \qquad (35)$$

The relevant portion of the disclosure in the reference is herein incorporated by reference for the sake of disclosure.

$\sigma 1(\alpha^j)$, $\omega 1(\alpha^j)$ and $\sigma 1_{odd}(\alpha^j)$ are derived by sequentially replacing power of $\alpha^j$ of $\alpha(j=1, -, N)$ to $\sigma 1(z)$, $\omega 1(z)$ and $\sigma 1_{odd}(z)$. This method is referred to as Chien solution.

FIG. 14 is a block diagram showing a construction of the error position and error value calculating portion 4 of FIG. 9. In FIG. 14, the error position and error value calculating portion 4 is constructed with the error position Chien solution portion 41, the error value denominator Chien solution portion 42, the error value numerator Chien solution portion 43, the error position judgment portion 44, Galois field division circuit 45 and the counter 46.

The counter 46 is responsive to the error position polynomial coefficient $\sigma 1_0$ to $\sigma 1_8$ and $\sigma 2_0$ to $\sigma 2_8$ and the error value polynomial coefficient $\omega 1_0$ to $\omega 1_7$ and $\omega 2_0$ to $\omega 2_7$, to be reset to zero. Subsequently, the counter 46 is incremented the counter value per clock.

FIG. 15 is a block diagram showing a construction of an error position Chien solution portion 41 of FIG. 14. In FIG. 15, the error position Chien solution portion 41 is constructed with the (0)th to (8)th component calculating portions 411 to 418 and the first to third Galois field adders 419 to 421.

FIG. 16 is a block diagram showing a construction of the (i)th order component calculating portion 411 of FIG. 15. In FIG. 16, the (i)th order component calculating portion 41$i$ is constructed with the first stage feedback shift register 41$i$1, the second stage feedback shift register 41$i$2, the feedback shift register input signal selector 41$i$3 and the three parallel Galois field multiplier 41$i$4.

The operation of the error position Chien solution portion 41 will be discussed with reference to FIGS. 15 and 16. The feedback shift register input signal selector 41$i$3 outputs $\sigma 1i$ when the counter value is zero, outputs $\sigma 2i$ when the counter value is one, and the output of the first stage feedback shift register 41$i$1 is output when the counter value is other than zero to one.

The output of the feedback shift register input signal selector 41$i$3 is input to the second stage feedback shift register 41$i$2. The second stage feedback shift register 41$i$2 delays the input signal for one clock to output to the three parallel Galois field multiplier 41$i$4.

Assuming that the input signal of three parallel Galois field multiplier 41$i$4 is INMULT, the three parallel Galois field multiplier 41$i$4 performs processes as expressed by:

$$\sigma MULT1_i = INMULT * \alpha^i \qquad (36-1)$$

$$\sigma MULT2_i = INMULT * \alpha^{2i} \qquad (36-2)$$

$$\sigma MULT3_i = INMULT * \alpha^{3i} \qquad (36-3)$$

to output $\sigma MUL1i$ to $\sigma MUL3i$ are output to the first to third Galois filed adders 419 to 421.

The input signal INMULT performs three Galois file constant multiplications during process according to the expressions (36-1) to (36-3). There are many common arithmetic operations among three Galois field constant multiplication. In the shown embodiment of the present invention, similarly to the syndrome coefficient updating pre-process portion 21, common arithmetic operations are take as common for three multiplication to realize three Galois field constant multiplication with a combined circuit of 8 bit input and 24 bit output for reducing circuit scale.

The output $\sigma MUL3_i$ of the three parallel Galois field multiplier 41$i$4 is branched into two to be also output to the first stage feedback shift register 41$i$1. The first and second stage feedback shift registers 41$i$1 and 41$i$2 shift the content of the shift registers per clock. When the counter value is 1, the output $\sigma MUL3_i$ is $\sigma 1_i * \alpha^{3*i}$. The value $\sigma 1_i * \alpha^{3*i}$ is shifted through the first and second stage feedback shift registers 41$i$1 and 41$i$2 and is input to the three parallel Galois field multiplier 41$i$4 when the counter value is 3.

At this time, $\sigma MUL3_i$ becomes $\sigma 1_i * \alpha^{2*3*i}$. Similarly, when the counter value is 2, the output $\sigma MUL3_i$ becomes $\sigma 2_i * \alpha^{3*i}$. When the counter value is 4, the output $\sigma MUL3_i$ becomes $\sigma 2_i * \alpha^{2*3*i}$.

In the shown embodiment according to the present invention, by employing two stages of feedback shift register, two code words are processed with two clocks. When the counter value is J*2+C (C=1, 2), the outputs of the three parallel Galois field Multiplier 41$i$4 are expressed as:

$$\sigma MULT1_i = \sigma C_i * \alpha^{(3*J+1)*i} \qquad (37-1)$$

$$\sigma MULT2_i = \sigma C_i * \alpha^{(3*J+2)*i} \qquad (37-2)$$

$$\sigma MULT3_i = \sigma C_i * \alpha^{(3*J+3)*i} \qquad (37-3)$$

The first Galois field adder 419 takes $\sigma MUL10$ to $\sigma MUL8$ output from the (0)th to (8)th component calculating portions 411 to 418 to output the result of addition $\sigma SUM1$ to the error position judgment portion 44. Similarly, the second and third Galois field adder 420 and 421 output the result of addition $\sigma SUM2$ to $\sigma SUM3$ to the error position judgment portion 44.

When the counter value is J*2+C (C=1, 2), the outputs $\sigma SUM1$ to $\sigma SUM3$ are expressed as:

$$\begin{aligned}\sigma SUM1 &= \sigma MULT1_0 + \ldots + \sigma MULT1_8 \\ &= \sigma C_0 + \sigma C_1 * \alpha^{(3*J+1)} + \sigma C_2 * \alpha^{(3*J+1)*2} + \ldots + \\ &\quad \sigma C8 * \alpha(3*J+1)*8 \\ &= \sigma C(\alpha^{3*J+1})\end{aligned} \qquad (38\text{-}1)$$

$$\begin{aligned}\sigma SUM2 &= \sigma MULT2_0 + \ldots + \sigma MULT2_8 \\ &= \sigma C_0 + \sigma C_1 * \alpha^{(3*J+2)} + \sigma C_2 * \alpha^{(3*J+2)*2} + \ldots + \\ &\quad \sigma C_8 * \alpha^{(3*J+2)*8}\end{aligned} \qquad (38\text{-}2)$$

$$\begin{aligned}\sigma SUM3 &= \sigma MULT3_0 + \ldots + \sigma MULT3_8 \\ &= \sigma C_0 + \sigma C_1 * \alpha^{(3*J+3)} + \sigma C_2 * \alpha^{(3*J+3)*2} + \ldots + \\ &\quad \sigma C_8 * \alpha^{(3*J+3)*2} \\ &= \sigma C(\alpha^{3*J+3})\end{aligned} \qquad (38\text{-}3)$$

It can be appreciated that the error position Chien solution portion 41 outputs the result of arithmetic operation obtained by sequentially replacing power of $\alpha^{j(j=1,-,N)}$ of $\alpha$ per three elements for the error value polynomial $\sigma 1$ and $\sigma 2$ from the expressions (38-1) to (38-3). The results of sequential replacement for $\sigma 1$ and results of sequential replacement for $\sigma 2$ are output alternately.

The error value denominator Chien solution portion 42 takes coefficients ($\sigma 1_1$, $\sigma 1_3$, $\sigma 1_5$, $\sigma 1_7$) and ($\sigma 2_1$, $\sigma 2_3$, $\sigma 2_5$, $\sigma 2_7$) of the error value denominator polynomials $\sigma 1_{odd}$ and $\sigma 2_{odd}$ as input to output the result $\sigma_{odd}$SUM1 to $\sigma_{odd}$SUM3 derived by sequentially replacing powers of $\alpha$ to three elements for error value denominator polynomial $\sigma 1_{odd}$ and $\alpha 2_{odd}$. Accordingly, the error value denominator Chien solution portion 42 can be realized by similar architecture as the error position Chien solution portion 41.

When the counter value is J*2+C(C=1, 2), $\sigma_{odd}$SUM1 to $\sigma_{odd}$SUM3 are expressed by:

$$\sigma_{odd}SUM1 = \sigma_{odd}C(\alpha^{3*J+1}) \quad (39\text{-}1)$$

$$\sigma_{odd}SUM2 = \sigma_{odd}C(\alpha^{3*J+2}) \quad (39\text{-}2)$$

$$\sigma_{odd}SUM3 = \sigma_{odd}C(\alpha^{3*J+3}) \quad (39\text{-}3)$$

The error value numerator Chien solution portion 43 takes the coefficients $\omega 1_0$ to $\omega 1_7$, $\omega 2_0$ to $\omega 2_7$ of the error value polynomial $\omega 1$ and $\omega 2$ as input to output the results $\omega$SUM1 to $\omega$SUM3 derived by sequentially replacing powers of $\alpha$ for three elements for the error value polynomials $\omega 1$ and $\omega 2$. Accordingly, the error value numerator Chien solution portion 43 can be realized by similar architecture as the error position Chien solution portion 41.

When the counter value is J*2+C (C=1, 2), $\omega$SUM1 to $\omega$SUM3 are expressed by:

$$\omega SUM1 = \omega C(\alpha^{3*J+1}) \quad (40\text{-}1)$$

$$\omega SUM2 = \omega C(\alpha^{3*J+2}) \quad (40\text{-}2)$$

$$\omega SUM3 = \omega C(\alpha^{3*J+3}) \quad (40\text{-}3)$$

The Galois field division circuit 45 performs division of $\omega$SUM1 to $\omega$SUM3 and $\sigma$oddSUM1 to $\sigma$oddSUM3, and results of division EV1 to EV3 are output to the error position judgment portion 44.

When the counter value is J*2+C (C=1, 2), EV1 to EV3 are expressed by:

$$\begin{aligned} EV1 &= (\omega SUM1)/(\sigma oddSUM1) \\ &= [\omega C(\alpha^{3*J+1})]/[\sigma_{odd}C(\alpha^{3*J+1})] \end{aligned} \quad (41\text{-}1)$$

$$\begin{aligned} EV2 &= (\omega SUM2)/(\sigma oddSUM2) \\ &= [\omega C(\alpha^{3*J+2})]/[\sigma_{odd}C(\alpha^{3*J+2})] \end{aligned} \quad (41\text{-}2)$$

$$\begin{aligned} EV3 &= (\omega SUM3)/(\sigma oddSUM3) \\ &= [\omega C(\alpha^{3*J+3})]/[\sigma_{odd}C(\alpha^{3*J+3})] \end{aligned} \quad (41\text{-}3)$$

The error position judgment portion 44 makes judgment of the error position from the input signals $\sigma$SUM1 to $\sigma$SUM3. From the expressions (38-1) to (38-3) and (41-1) to (41-3), when the counter value is J*2+C (C=1, 2) and when $\sigma$SUMi=0, judgment can be made that error of the error value EVi in (N−(3*J+i))th order component $YC_{N-(3*J+i)}$ of the (C)th code word. At this time, the error position judgment portion 44 outputs the error position (N−3*J+i) and the error value EVi to the error correcting portion 6.

The error correcting portion 6 corrects the received code word stored in the received code word storage portion 5 on the basis of the error position and the error value input from the error position and error value calculating portion 4 to externally output the corrected code word.

In the prior art, when a plurality of codewords are decoded simultaneously, each individual decoder is assigned for each code word to make circuit scale and power consumption large. In another embodiment of the present invention, significant reduction of the circuit scale and power consumption by simultaneously decoding a plurality of code words with one decoder 1.

Namely, when L in number of codes are decoded simultaneously, in comparison with the circuit construction of the prior art, the decoder can be realized by adding (L−1) in number of shift registers in the syndrome calculating portion 2 and (L−1) in number of shift registers in the error position and error value calculating portion 4 to significantly reduce circuit scale. When parallel process is to be performed, by making common Galois filed constant multiplication in common, scale of the circuit can be reduced significantly.

It should be appreciated that the decoding circuit of general BCH code may also be realized with similar circuit construction as the decoding circuit of the Read-Solomon code. Accordingly, the embodiment of the present invention is generally applicable for BCH code.

While the foregoing embodiment employs the error position polynomial and error value polynomial leading circuit separately for the first code word and the second code word. Assuming that the number of code words is L, code length is N block, number of parallel process is M, if predetermined clocks for arithmetic operation of the error position polynomial and error value polynomial leading circuit is less than or equal to N/M clock, the error position polynomial and error value polynomial leading circuit can be common in the first to (L)th code words.

Figure 17:
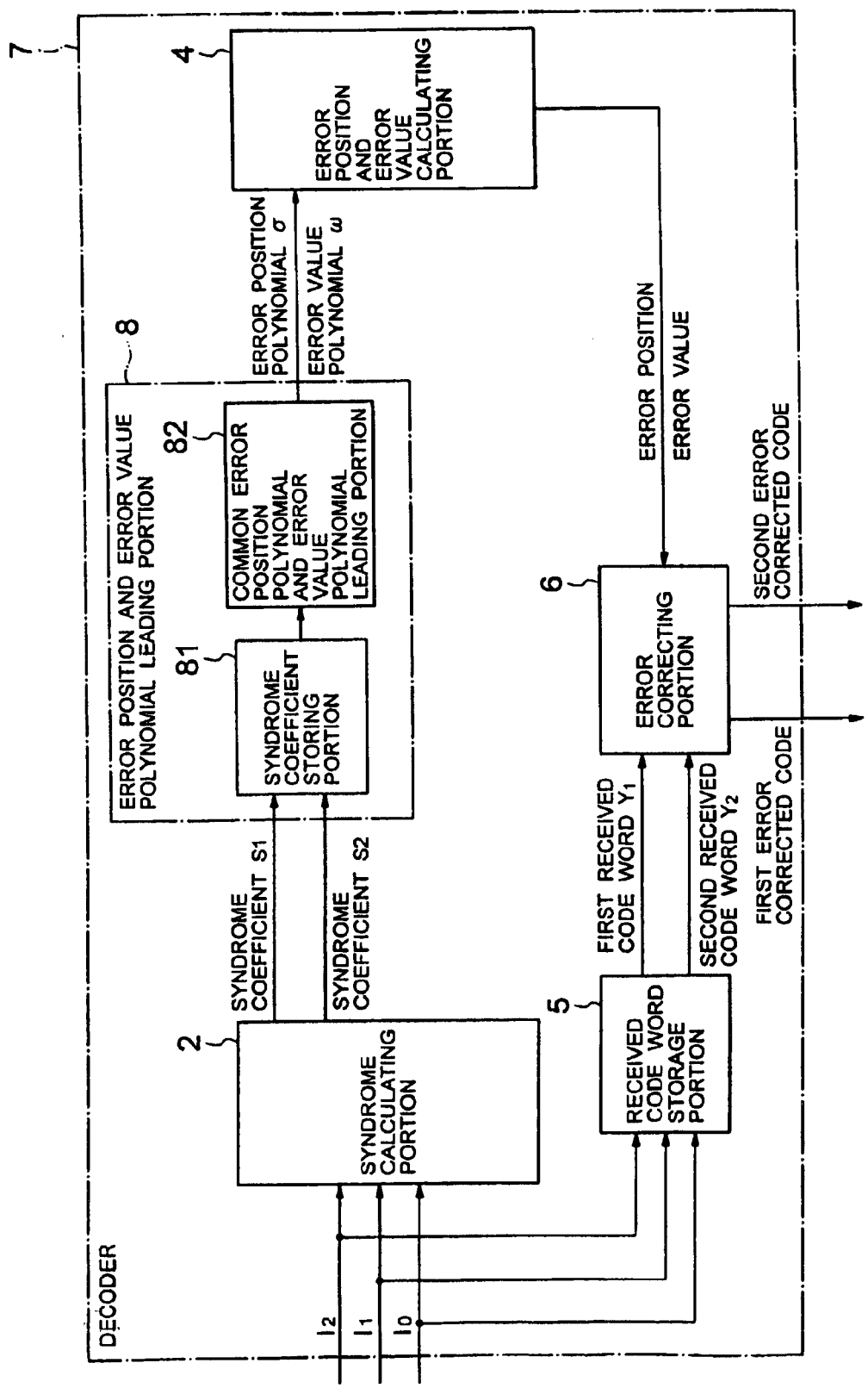
FIG. 17 is a block diagram showing a construction of a further embodiment of a deciding circuit according to the present invention.

FIG. 17 is a block diagram showing a construction of a further embodiment of a deciding circuit according to the present invention. In FIG. 17, similarly to the foregoing embodiment of the present invention, the decoding circuit according to the present invention is illustrated in terms of an example where the code length is 255 bytes, the redundant inspection signal is 16 bytes, the number of parallel processes is 3 and number of the code words is 2. A further embodiment of a decoder 7 according to the present invention is a READ-SOLOMON decoding circuit similar to the former embodiment of the present invention.

To the syndrome calculating portion 2 of the decoder 7,510 bytes in one frame is input as three parallel inputs. Accordingly, the syndrome calculating portion 2 outputs syndrome coefficients for two code words to error position polynomial and error value polynomial leading portion 8 at every 170 clocks. Therefore, if the error position polynomial and error value polynomial leading circuit, in which number of clocks required for leading the error position polynomial and error value polynomial of one code word is less than or equal to 85, the error position polynomial and error value polynomial leading circuit can be used in common for the first and second code words.

The error position polynomial and error value polynomial leading portion 8 in further embodiment of the present invention is constructed with a syndrome coefficient storing portion 81 and a common error position polynomial and error value polynomial leasing portion 82.

The syndrome coefficient storing portion 81 alternately outputs syndrome coefficients S1 and S2 inputted from the syndrome calculating portion 2 to the common error position polynomial and error value polynomial leasing portion 82 per 85 clocks. The common error position polynomial and error value polynomial leasing portion 82 leads the error position polynomial $\sigma$ and the error value polynomial $\omega$ on the basis of the input syndrome coefficient S to output to the error position and error value calculating portion 4 per 85 clocks.

Namely, to the error position and error value calculating portion 4, the error position polynomial $\sigma 1$ and the error value polynomial ω1 for the first code word, and the error position polynomial σ2 and the error value polynomial ω2 for the second code word are input alternately. Accordingly, in a further embodiment of the present invention, the error position and error value calculating portion 4 may calculate the error position and error value by 85 clocks.

Figure 18:
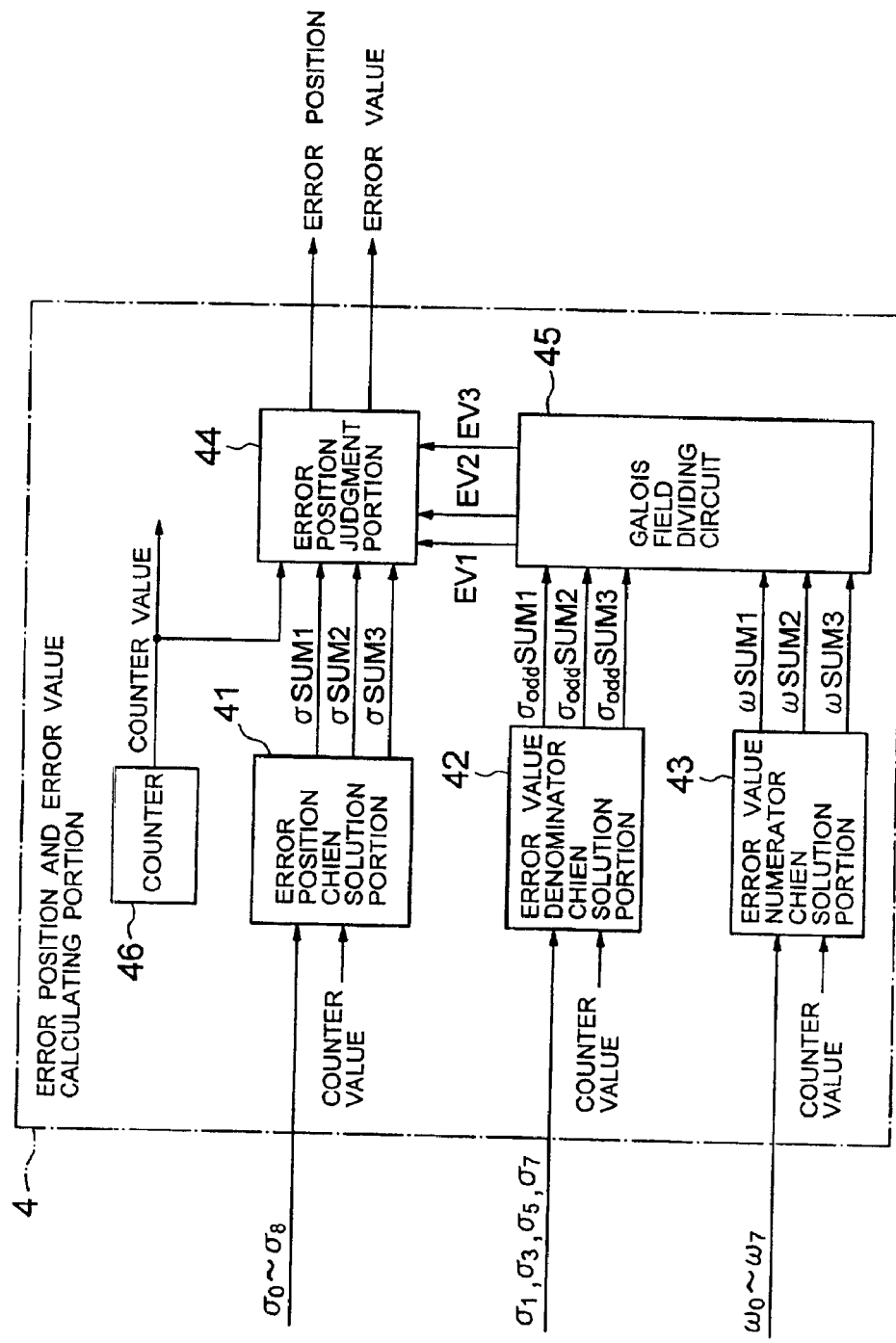
FIG. 18 is a block diagram showing c construction of an error position and error value calculating portion of FIG. 17.

FIG. 18 is a block diagram showing c construction of an error position and error value calculating portion 4 of FIG. 17. In FIG. 18, the error position and error value calculating portion 4 is constructed with the error position Chien solution portion 41, the error value denominator Chien solution portion 42, the error value numerator Chien solution portion 43, the error position judgment portion 44, the Galois field division circuit 415 and the counter 46.

The counter 46 is reset to zero when the error position polynomial coefficients $\sigma_1$ to $\sigma_8$ and the error value polynomial coefficients $\omega_0$ to $\omega_7$ corresponding one code word are input. Subsequently, the counter 46 is incremented the counter value per clock. The counter 46 is not reset to zero when the error position polynomial coefficients $\sigma_1$ to $\sigma_8$ and the error value polynomial coefficients ω0 to ω7 corresponding second code word are input.

Figure 19:
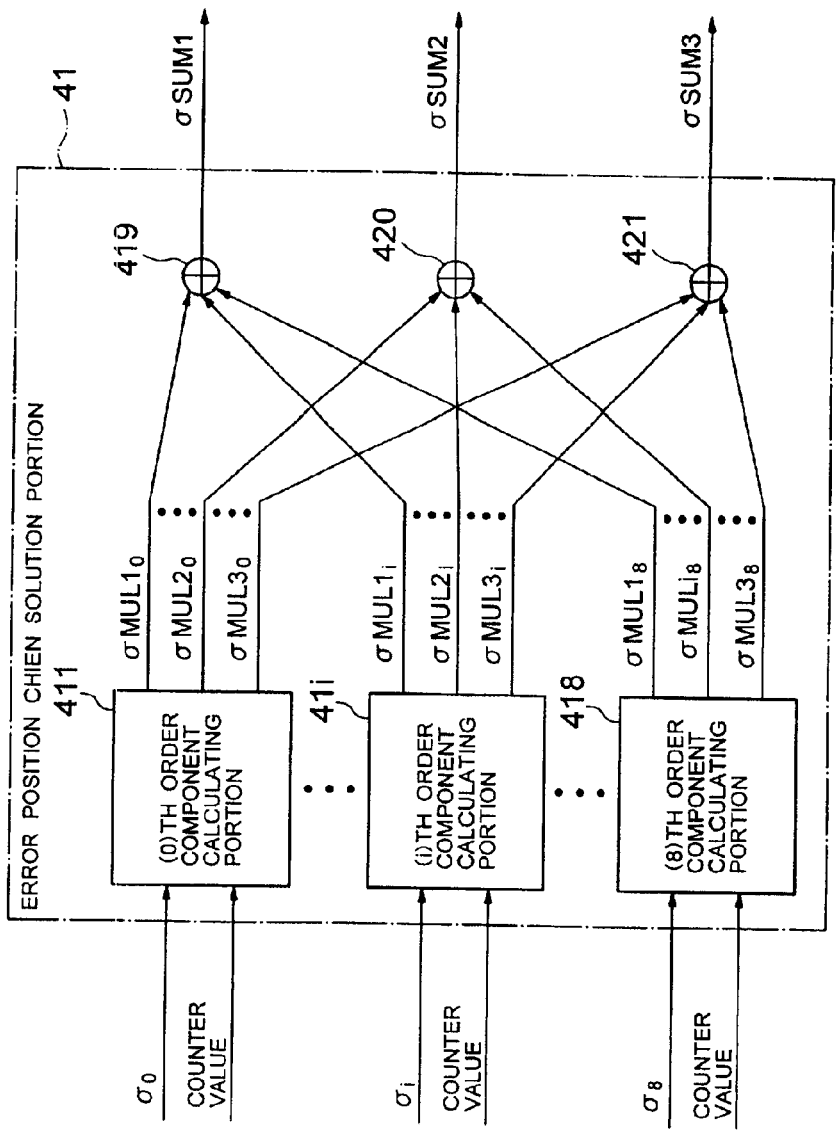
FIG. 19 is a block diagram showing a construction of an error position Chien solution portion of FIG. 18.

FIG. 19 is a block diagram showing a construction of an error position Chien solution portion 41 of FIG. 18. In FIG. 19, the error position Chien solution portion 41 is constructed with the (0)th to (8)th component calculating portions 411 to 418 and the first to third Galois field adders 419 to 421.

Figure 20:
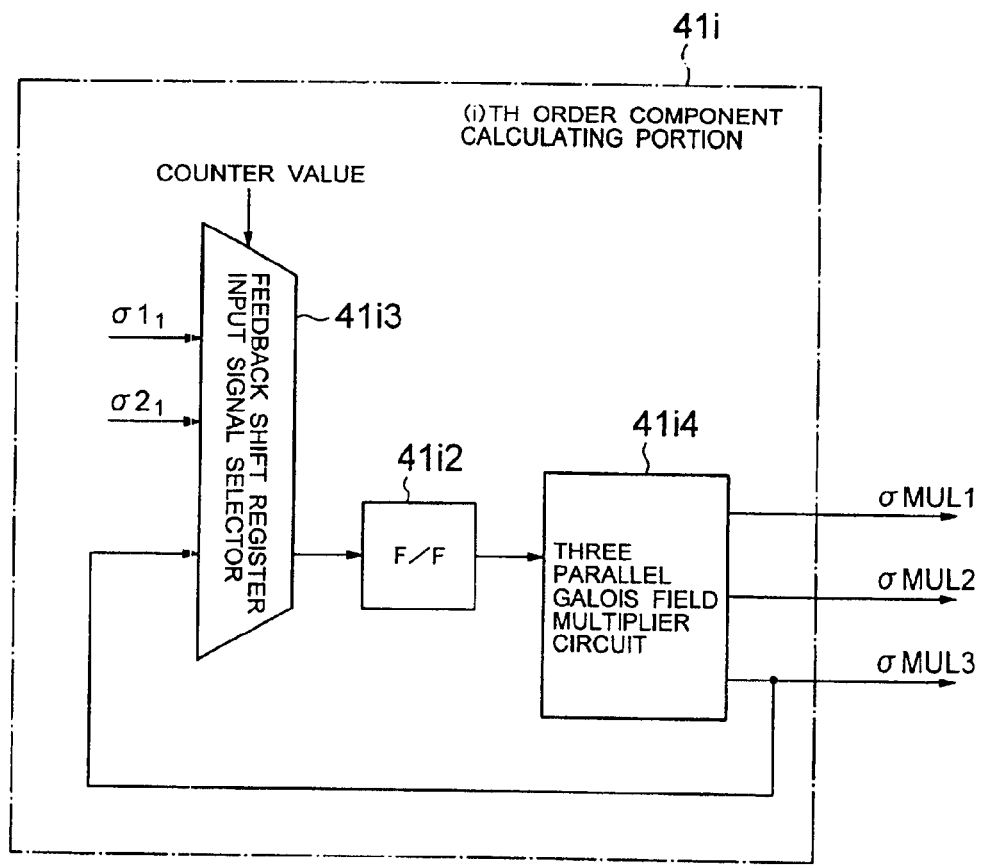
FIG. 20 is a block diagram showing a construction of the (i)th order component calculating portion of FIG. 19.

FIG. 20 is a block diagram showing a construction of the (i)th order component calculating portion 41i of FIG. 19. In FIG. 20, as (i)th order component calculating portion 41i is constructed with the feedback shift register 41i2, the feedback shift register input signal selector 41i3 and the three parallel Galois field multiplier 41i4.

Discussion will be given for operation of the error position Chien solution portion 41 with reference to FIGS. 19 and 20. The feedback shift register input signal selector 41i3 outputs σ1 when the counter value is 0 or 85. When the counter value is other than 0 and 85, the third output σMUL3 of the three parallel Galois field multiplier 41i4 is output to the feedback shift register 41i2. The feedback shift register 41i2 delays the input signal for one clock to output to the three parallel Galois field multiplier 41i4.

The input signal of the three parallel Galois field multiplier 41i4 is taken as INMULT, the three parallel Galois field multiplier 41i4 performs the process expressed by the foregoing expressions (36-1) to (36-3) to output σMUL1$_i$ to σMUL3$_i$ to the first to third Galois field adders 419 to 421. When the counter value is (C−1)*85+J (C=1, 2), the output of the three parallel Galois field multiplier 41i4 is expressed by the foregoing expressions (37-1) to (47-3).

The first Galois field adder 419 takes σMUL1$_1$ to σMUL1$_8$ output from the (0)th to (8)th component calculating portions 411 to 418 as input to output the result of addition σSUM1 to the error position judgment portion 44. Similarly, the second and third Galois field adders 420 and 421 output the result of addition σSUM2 and σSUM3 to the error position judgment portion 44. When the counter value is (C−1)*85+J (C=1, 2), the outputs σSUM1 to σSUM3 are expressed by (38-1) to (38-3).

The error value denominator Chien solution portion 42 takes the coefficients ($\sigma_1$, $\sigma_3$, $\sigma_5$, $\sigma_7$) of the error value denominator polynomial σodd as input to output the for outputting results $\sigma_{odd}$SUM1 to $\sigma_{odd}$SUM3 derived by sequentially replacing power of α for three elements to the Galois field division circuit 45. The error value denominator Chien solution portion 42 can be realized by similar architecture as the error position Chien solution portion 41. When the counter value is (C−1)*85+J (C=1, 2), $\sigma_{odd}$SUM1 to $\sigma_{odd}$SUM3 are expressed by the foregoing expressions (39-1) to (39-3).

The error value numerator Chien solution portion 43 takes the coefficients takes the coefficients ω0 to ω7 of the error value polynomial ω as input to output the results ωSUM1 to ωSUM3 derived by sequentially replacing powers of a for three elements to the Galois field division circuit 45. The error value numerator Chien solution portion 43 can be realized by similar architecture to the error position Chien solution portion 41. When the counter value is (C−1)*85+J (C=1, 2), ωSUM1 to ωSUM3 can be expressed by the foregoing expressions (40-1) to (40-3).

If The Galois field division circuit 45 performs division of ωSUM1 to ωSUM3 and σoddSUM1 to ωoddSUM3 to output the result of division EV1 to EV3 to the error position judgment portion 44. When the counter value is (C−1)*85+J (C=1, 2), EV1 to EV3 can be expressed by the foregoing expressions (41-1 to (41-3).

The error position judgment portion 44 makes judgment of error position from the input signals σSUM1 to σSUM3. When the counter value is (C−1)*85+J (C=1, 2), when σSUMi=0, judgment can be made that error of the error value EV1 is caused in the (N−(3*J+i))th order component $YC_{N-(3*J+i)}$ the (C)th code word. At this time, the error position judgment circuit 44 outputs the error position N−(3*J+i) and the error value EVi to the error correction circuit 6.

The error correcting portion 6 corrects the received code word stored in the received code word storage portion 5 on the basis of the error position and the error value input from the error position and error value calculating portion 4 to externally output the corrected code word.

In a further embodiment of the present invention, the error position polynomial and error value polynomial leading circuit is taken in common for a plurality of code words to significantly reduce circuit scale and the power consumption.

It should be noted that the code length is 254 bytes, the redundant inspection signal 16 bytes, number of parallel process is 3 and the number of code word is 2, the code length is not divisible to have a remainder 1. In this case, leading auxiliary signal of 1 byte is added to the leading end of the frame format of the input signal to preliminarily set 0 as the value of the leading end auxiliary signal. Thus, by using the leading end auxiliary signal, it becomes possible to perform parallel process in the circuit similar to the former embodiment of the present invention. It should be noted that, in this case, the leading end auxiliary signal portion is not become an object for error correction.

In general, for the code length N, when number of parallel process is taken as M, parallel coding process circuit can be realized even when the code length N is not divisible by number M of the parallel process by adding the leading end auxiliary signal of minimum natural number P for making (N+P) divisible by M.

With the present invention set forth above, in the decoding circuit to be employed in the system where a plurality of code words are transmitted in interleaved fashion and a plurality of code words are decoded simultaneously on reception side, scale of circuit and power consumption can be significantly reduced by performing decoding simultaneously of a plurality of code words with single decoder.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A decoding circuit, for decoding a plurality of code words transmitted in interleaved manner to simultaneously decode a plurality of code words on a reception side, said decoding circuit comprising a decoder which decodes a plurality of said code words simultaneously, wherein said decoder comprises:

syndrome calculating means for deriving a syndrome polynomial of the plurality of code words;

error position polynomial and error value polynomial leading means for leading an error position polynomial and error value polynomial for the plurality of code words on the basis of coefficients of the syndrome polynomial derived by said syndrome calculating means;

error position and error value calculating means for leading an error position and an error value of the code word on the basis of coefficients of the error position and the coefficient of the error value lead by said error position polynomial and error value polynomial leading means; and error correcting means for correcting a received code word on the basis of the error position and the error value lead by said error position and error value calculating means.

2. A decoding circuit as set forth in claim 1, wherein said syndrome calculating means and said error position and error value calculating means use common parallel Galois field constant multiplication in common.

3. A decoding circuit as set forth in claim 1, wherein when the code length is N blocks (N being a positive integer) and the number of parallel processes is M (M being a positive integer), the error position polynomial and error number polynomial leading means are used in common for a plurality of code words when the number of clocks for a predetermined arithmetic operation of the error position polynomial and error value polynomial leading means is less than or equal to N/M clocks.

4. A decoding circuit as set forth in claim 3, wherein when division of the code length N by the parallel process number M does not result in an integer, a leading auxiliary signal of the least natural number P is added to N so that division of (N+P) by the parallel process number M results in an integer.

5. A decoding circuit as set forth in claim 1, wherein when a plurality of code words is L, a number (L−1) of shift registers are respectively added to said syndrome calculating means and said error position and error value calculating means to enable simultaneous decoding of the L code words.

6. A decoding circuit as set forth in claim 1, wherein BCH (Bose-Chaudhuri-Hocquenghen) code is applicable.

7. A decoding circuit as set forth in claim 6, wherein the BCH code comprises a Read-Solomon code.

8. A decoding circuit as set forth in claim 1, wherein:
the number of code words is L, and
said error position and error value polynomial leading means includes L code word error position and error value polynomial leading portions.

9. A decoding circuit as set forth in claim 8, wherein L=2.

10. A decoding circuit as set forth in claim 1, wherein:
the number of code words is 2, and
said error position and error value polynomial leading means comprises a syndrome coefficient storing portion for storing syndrome coefficients received from said syndrome calculating portion, and a common error position polynomial and error value polynomial leading portion for alternately outputting the stored syndrome coefficients.

11. A decoding method for use in a system wherein a plurality of code words are transmitted in interleaved manner and a plurality of code words are simultaneously decoded on a reception side, said method simultaneously decoding a plurality of the code words with a single decoder, wherein said method comprises:

syndrome calculating by deriving a syndrome polynomial of the plurality of code words;

error position polynomial and error value polynomial leading by leading an error position polynomial and an error value polynomial for the plurality of code words on the basis of coefficients of the calculated syndrome polynomial;

error position and error value calculating by leading error position and error value of the code word on the basis of coefficients of the lead error position and coefficient of said error value; and error correcting by correcting a received code word on the basis of the calculated error position and error value.

12. A decoding method as set forth in claim 11, wherein the syndrome calculating step and the error position and error value calculating use common parallel Galois field constant multiplication in common.

13. A decoding method as set forth in claim 11, wherein when the code length is N blocks (N being a positive integer) and the number of parallel processes is M (M being a positive integer), the error position polynomial and error number polynomial leading are used in common for a plurality of code words when the number of clocks for a predetermined arithmetic operation of the error position polynomial and error value polynomial leading is less than or equal to N/M clocks.

14. A decoding method as set forth in claim 13, wherein when division of the code length N by the parallel process number M does not result in an integer, a leading auxiliary signal of the least natural number P is added so that division of (N+P) by the parallel process number M results in an integer.

15. A decoding method as set forth in claim 11, wherein when the plurality of code words is L, a number (L−1) of shift register operations are respectively added to the syndrome calculating and the error position and error value calculating to enable simultaneous decoding of L code words.

16. A decoding method as set forth in claim 11, wherein BCH (Bose-Chaudhuri-Hocquenghen) code is applicable.

17. A decoding method as set forth in claim 16, wherein the BCH code comprises a Read-Solomon code.

18. A decoding method as set forth in claim 11, wherein:
the number of code words is 2, and
the error position and error value polynomial leading comprises storing syndrome coefficients received from said syndrome calculating portion, and alternately outputting the stored syndrome coefficients.

19. A decoding circuit, for decoding a plurality of code words transmitted in interleaved manner to simultaneously decode a plurality of code words on a reception side, said decoding circuit comprising:

a syndrome calculating circuit that derives a syndrome polynomial of the plurality of code words;

an error position polynomial and error value polynomial leading circuit that leads an error position polynomial and error value polynomial for the plurality of code words on the basis of coefficients of the syndrome polynomial derived by said syndrome calculating circuit;

an error position and error value calculating circuit that leads an error position and an error value of the code word on the basis of coefficients of the error position and the coefficient of the error value lead by said error position polynomial and error value polynomial leading circuit; and an error correcting circuit that corrects a received code word on the basis of the error position and the error value lead by said error position and error value calculating circuit, so that said decoding circuit decodes the plurality of code words simultaneously.

* * * * *